(12) United States Patent
Konishi et al.

(10) Patent No.: US 11,177,629 B2
(45) Date of Patent: Nov. 16, 2021

(54) LIGHT SOURCE DEVICE, LIGHT SOURCE DRIVER, AND LIGHTING SYSTEM

(71) Applicant: PANASONIC INTELLECTUAL PROPERTY MANAGEMENT CO., LTD., Osaka (JP)

(72) Inventors: Hirofumi Konishi, Osaka (JP); Shigeaki Yamasaki, Osaka (JP); Erika Kawabata, Kyoto (JP); Yoshiharu Nagatani, Osaka (JP); Hiroshi Kitano, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 35 days.

(21) Appl. No.: 16/867,128

(22) Filed: May 5, 2020

(65) Prior Publication Data

US 2020/0381886 A1     Dec. 3, 2020

(30) Foreign Application Priority Data

May 27, 2019 (JP) .............................. JP2019-098884
May 27, 2019 (JP) .............................. JP2019-098885
May 27, 2019 (JP) .............................. JP2019-098886

(51) Int. Cl.
*H01S 3/13*     (2006.01)
*H01S 5/068*    (2006.01)
(Continued)

(52) U.S. Cl.
CPC ...... *H01S 5/06825* (2013.01); *H01S 3/10015* (2013.01); *H01S 5/0087* (2021.01);
(Continued)

(58) Field of Classification Search
CPC .. H01S 3/10015; H01S 3/1301; H01S 3/1305; H01S 5/0608; H01S 5/0264;
(Continued)

(56) References Cited

U.S. PATENT DOCUMENTS 7,899,105 B1 *   3/2011   Hargis .................... H01S 5/146
                                                          372/102
10,222,474 B1 *  3/2019   Raring .................... F21V 29/70
(Continued)

FOREIGN PATENT DOCUMENTS

JP   H11-144882 A    5/1999
JP   2013-197033 A   9/2013
JP   2017-213980 A   12/2017

*Primary Examiner* — Kinam Park
(74) *Attorney, Agent, or Firm* — Greenblum & Bernstein, P.L.C.

(57) ABSTRACT

A light source device according to an embodiment is used with a light guide member and a wavelength converting member, and includes a light-emitting element, a light sensor, and a driving unit. The light-emitting element radiates a light beam to be incident on a first end of the light guide member by being supplied with a drive current. The light sensor detects signal light, which has been incident on a second end of the light guide member and transmitted to the first end. The driving unit supplies the drive current to the light-emitting element and controls the drive current based on a result of detection of the signal light.

32 Claims, 10 Drawing Sheets

(51) Int. Cl.
*H01S 3/10* (2006.01)
*H01S 5/06* (2006.01)
*H01S 5/026* (2006.01)
*H01S 5/0683* (2006.01)
*H01S 5/00* (2006.01)
*H01S 5/40* (2006.01)

(52) U.S. Cl.
CPC .......... *H01S 5/0264* (2013.01); *H01S 5/0608* (2013.01); *H01S 5/0683* (2013.01); *H01S 3/1301* (2013.01); *H01S 3/1305* (2013.01); *H01S 5/4018* (2013.01)

(58) Field of Classification Search
CPC .. H01S 5/0683; H01S 5/06825; H01S 5/0087; H01S 5/4018
See application file for complete search history.

(56) References Cited

U.S. PATENT DOCUMENTS

| | | | |
|---|---|---|---|
| 2013/0345517 A1* | 12/2013 | Morimoto | A61B 1/0661 600/178 |
| 2015/0180202 A1* | 6/2015 | Ishikawa | H01S 5/4025 315/119 |
| 2019/0259917 A1* | 8/2019 | Yamanaka | H01S 5/022 |

* cited by examiner

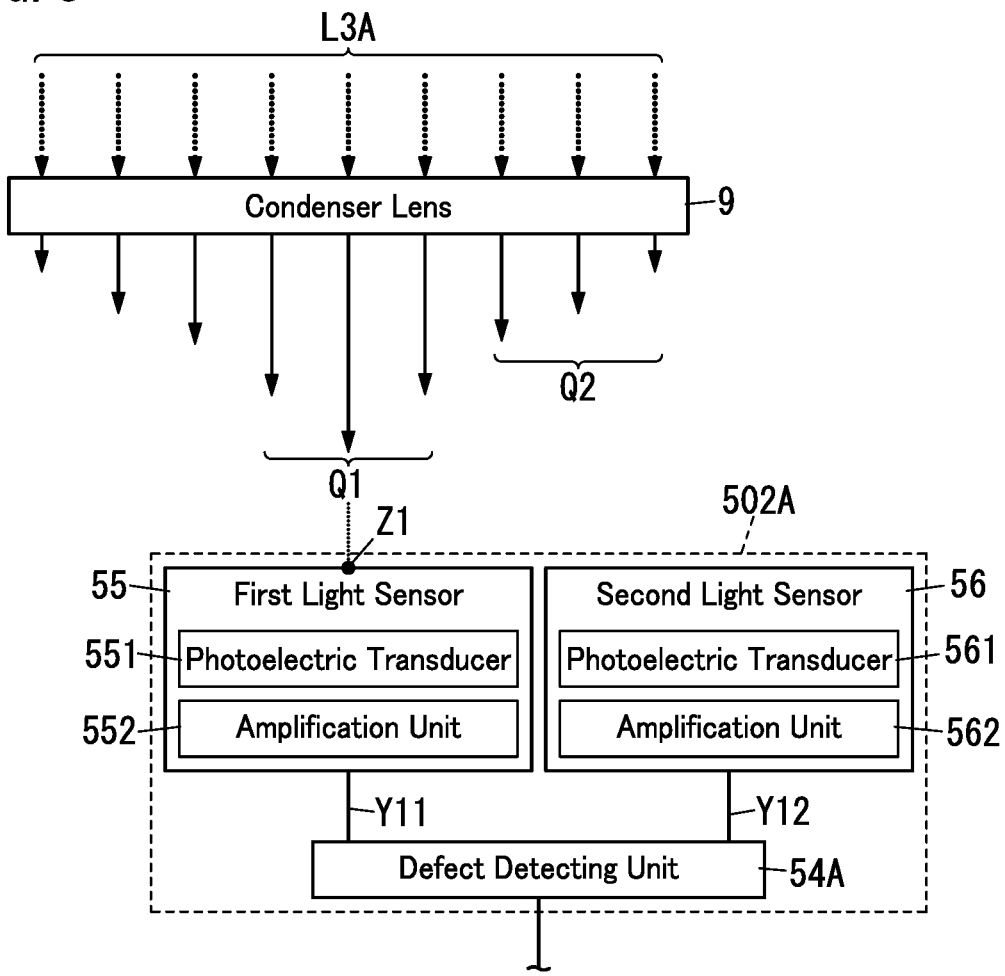

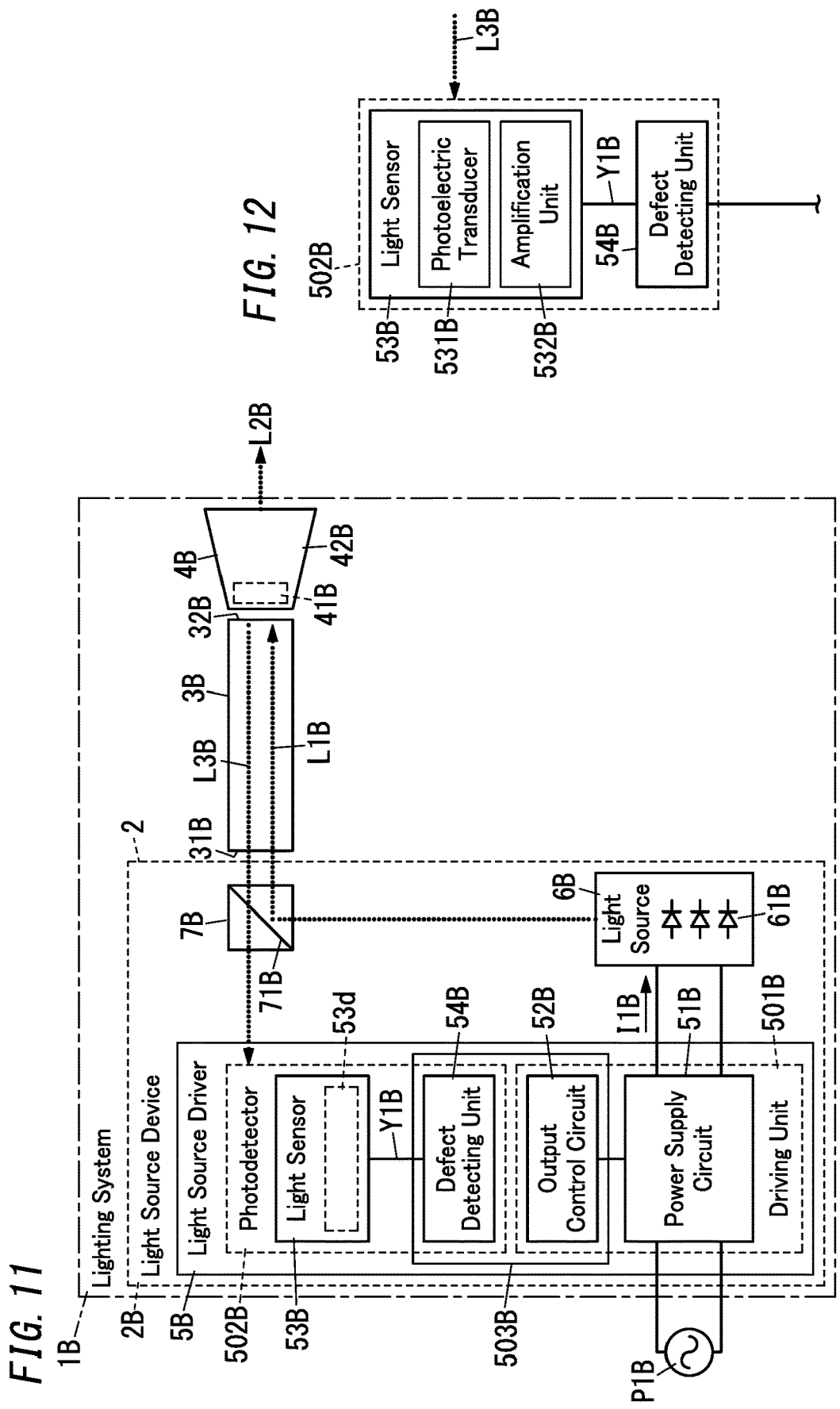

LIGHT SOURCE DEVICE, LIGHT SOURCE DRIVER, AND LIGHTING SYSTEM

CROSS-REFERENCE TO RELATED APPLICATION

The present application is based upon, and claims the benefit of foreign priority to, Japanese Patent Applications No. 2019-098884, No. 2019-098885, and No. 2019-098886, all filed on May 27, 2019, the entire contents of which are hereby incorporated by reference.

TECHNICAL FIELD

The present disclosure generally relates to a light source device, a light source driver, and a lighting system, and more particularly relates to a light source device, a light source driver, and a lighting system, in which light is transmitted through a light guide member.

BACKGROUND ART

JP 2017-213980 A discloses a lighting device (hereinafter referred to as a "known lighting device"), which uses a semiconductor laser diode.

In the known lighting device, a laser beam emitted from the laser diode is guided through a light guide member to an imaging lens, which condenses the laser beam onto a wavelength converting member. The laser beam thus condensed not only excites the wavelength converting member but also is scattered from the surface of the wavelength converting member. The wavelength converting member thus produces a yellow beam and the laser beam scattered from the surface of the wavelength converting member turns into a blue beam. Then, the yellow and blue beams are mixed together to produce white light, which is then transmitted through a convex lens and eventually emerges out of the lighting device.

The light guide member extends from one end toward the other end thereof. The semiconductor laser beam is arranged at the one end of the light guide member and the wavelength converting member and a photodetector unit are arranged at the other end of the light guide member with the imaging lens interposed between them.

The photodetector unit receives the white light, which is a mixture of yellow beams, including the one produced by the wavelength converting member, and the blue laser beam, and outputs a detection signal, which is an electrical signal representing the quantity of the light received, to a driver circuit. In response, the driver circuit controls the laser beam based on the detection signal.

In the known lighting device, a light-emitting element (semiconductor laser diode) is arranged at a first end (one end) of the light guide member and a light sensor (photodetector unit) is arranged at a second end (the other end) of the light guide member. That is to say, the light-emitting element and the light sensor are spaced apart from each other with the light guide member interposed between themselves, thus making the configuration overly complex.

SUMMARY

The present disclosure provides a light source device, a light source driver, and a lighting system, all of which include a light sensor and have a simplified configuration.

A light source device according to an aspect of the present disclosure is used with: a light guide member to guide light from a first end to a second end, and vice versa; and a wavelength converting member to convert a first light beam that has been incident on the first end and has emerged through the second end into a second light beam having a different wavelength from the first light beam. The light source device includes: at least one light-emitting element; a light sensor; and a driving unit. The at least one light-emitting element radiates the first light beam to be incident on the first end by being supplied with a drive current. The light sensor detects signal light, which is a component of the second light beam and which has been incident on the second end and transmitted to the first end. The driving unit supplies the drive current to the at least one light-emitting element and controls the drive current based on a result of detection of the signal light.

A light source driver according to another aspect of the present disclosure is for use with a light guide member, a wavelength converting member, and at least one light-emitting element. The light guide member guides light from a first end to a second end, and vice versa. The wavelength converting member converts a first light beam that has been incident on the first end and has emerged through the second end into a second light beam having a different wavelength from the first light beam. The at least one light-emitting element radiates the first light beam by being supplied with a drive current. The light source driver includes: a light sensor to detect signal light, which is a component of the second light beam and which has been incident on the second end and transmitted to the first end; and a driving unit to supply the drive current to the at least one light-emitting element and control the drive current based on a result of detection of the signal light.

A lighting system according to still another aspect of the present disclosure includes a light guide member, a wavelength converting member, at least one light-emitting element, a light sensor, and a driving unit. The light guide member guides light from a first end to a second end, and vice versa. The wavelength converting member converts a first light beam that has been incident on the first end and has emerged through the second end into a second light beam having a different wavelength from the first light beam. The at least one light-emitting element radiates the first light beam by being supplied with a drive current. The light sensor detects signal light, which is a component of the second light beam and which has been incident on the second end and transmitted to the first end. The driving unit supplies the drive current to the at least one light-emitting element and controls the drive current based on a result of detection of the signal light.

BRIEF DESCRIPTION OF DRAWINGS

FIG. 8 is a block diagram illustrating a configuration for the photodetector of the lighting system according to the second embodiment;

FIG. 11 is a block diagram illustrating a configuration for a lighting system including a photodetector according to a third embodiment;

FIG. 12 is a block diagram illustrating a configuration for the photodetector of the lighting system according to the third embodiment;

DESCRIPTION OF EMBODIMENTS

Embodiments of a light source device, light source driver, and lighting system according to the present disclosure will now be described with reference to the accompanying drawings. Note that the drawings to be referred to in the following description of embodiments are all schematic representations. That is to say, the ratio of the dimensions (including thicknesses) of respective constituent elements illustrated on the drawings does not always reflect their actual dimensional ratio.

First Embodiment (1.1) Overall Configuration for Lighting System

An overall configuration for a lighting system 1 according to a first embodiment will be described with reference to the accompanying drawings.

Figure 1:
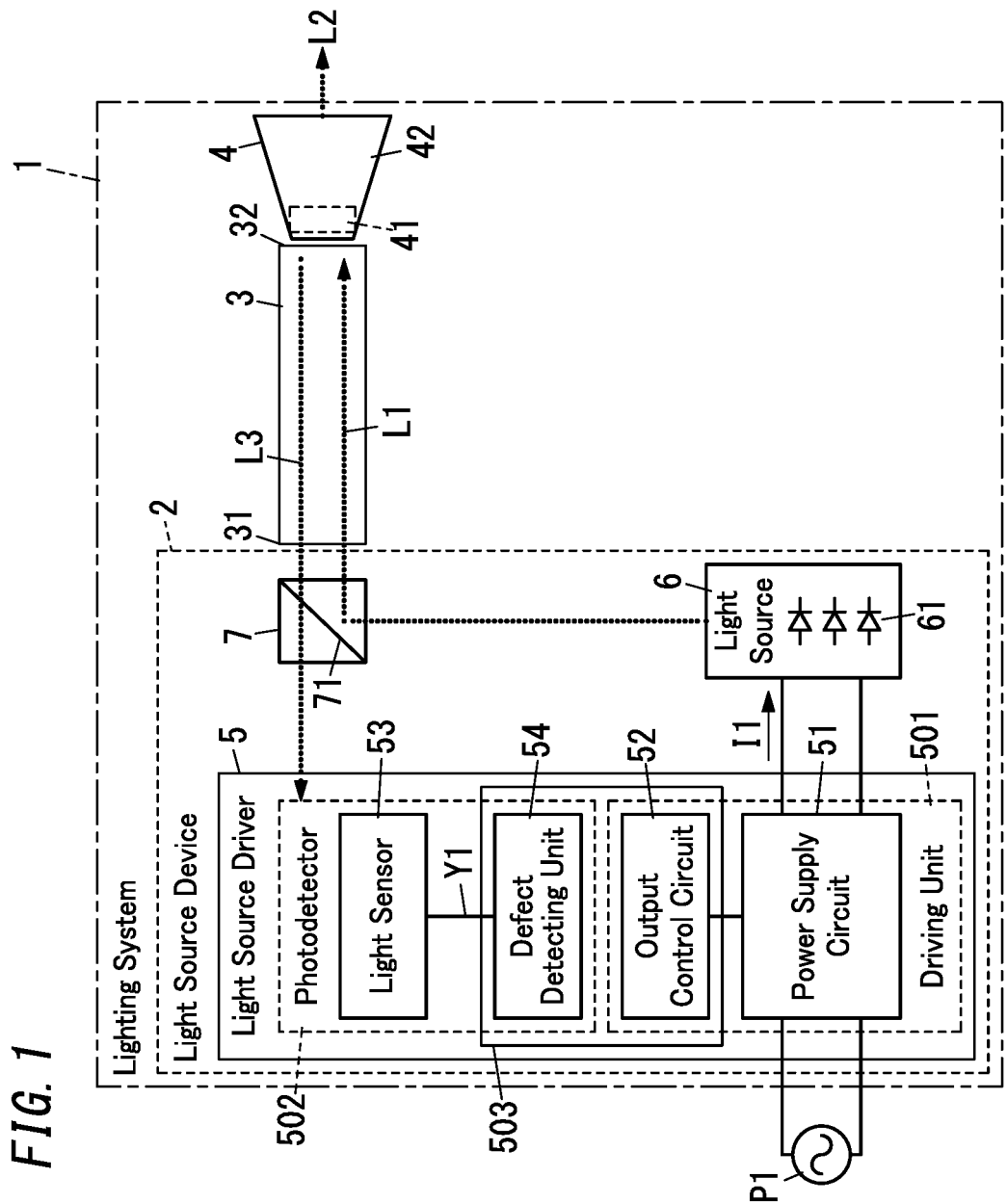
FIG. 1 is a block diagram illustrating a configuration for a lighting system including a light source device according to a first embodiment.

As shown in FIG. 1, the lighting system 1 includes a light source device 2, a light guide member 3, and a light distributor 4. The light source device 2 radiates a laser beam L1 (first light beam). The laser beam L1 is incident on a first end 31 of the light guide member 3, passes through the inside of the light guide member 3, and then emerges through a second end 32 of the light guide member 3. The laser beam L1 emerging through the second end 32 is converted by a wavelength converting member 41 of the light distributor 4 into a wavelength-converted light beam (second light beam). Most of the wavelength-converted light beam emerges, from the light distributor 4, as an illuminating light beam L2 to irradiate a lighting space. Meanwhile, part of the wavelength-converted light beam is incident as signal light L3 on the second end 32 of the light guide member 3. The signal light L3 passes through the inside of the light guide member 3 and emerges through the first end 31 of the light guide member 3.

Figure 2:
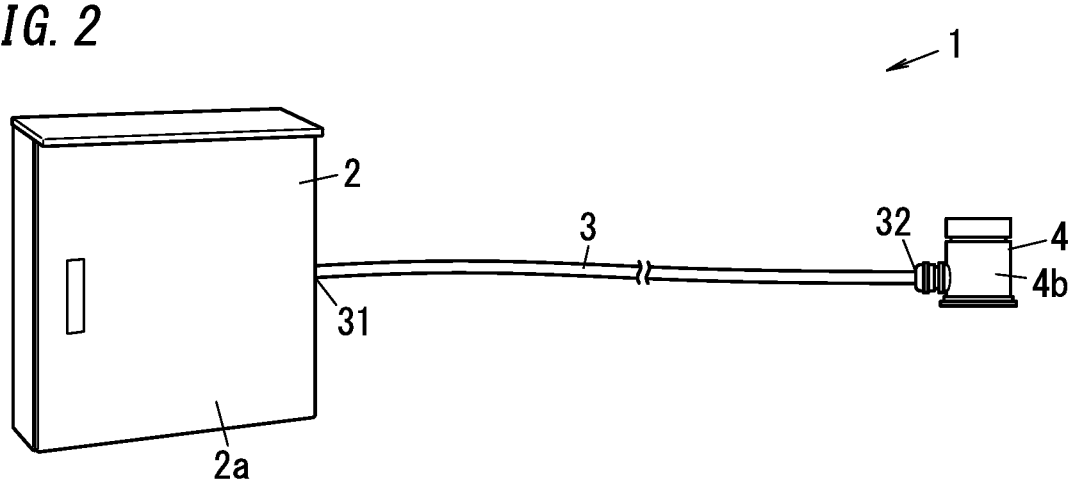
FIG. 2 illustrates the appearance of the lighting system according to the first embodiment.

The light source device 2 includes a light source driver 5, a light source 6, and an optical member 7. The light source driver 5 lights (i.e., turns ON) the light source 6 by supplying a DC drive current I1 to the light source 6. When supplied with the drive current I1, the light source 6 radiates the laser beam L1. The laser beam L1 emitted from the light source 6 is incident on the first end 31 of the light guide member 3 through the optical member 7. As shown in FIG. 2, the light source device 2 includes a housing 2a. The housing 2a houses the light source driver 5, the light source 6, and the optical member 7. The light source device 2 is used along with the light guide member 3 and the light distributor 4.

The light source driver 5 includes a driving unit 501 and a photodetector 502. The driving unit 501 is provided with an AC voltage by an AC power supply P1 and supplies a drive current I1 to the light source 6. The photodetector 502 detects the signal light L3 that has emerged from the first end 31 of the light guide member 3. The signal light L3 has been incident on the second end 32 of the light guide member 3, passed through the inside of the light guide member 3, and then emerged through the first end 31 of the light guide member 3.

This lighting system 1 may be used as, for example, an underwater lighting for radiating light under the water or a headlight for automobiles.

(1.2) Light Source

The light source 6 includes a plurality of light-emitting elements 61, each of which is implemented as a laser diode (laser element). When supplied with the drive current I1 from the driving unit 501, the plurality of light-emitting elements 61 may emit a blue laser beam L1, for example. In this embodiment, the plurality of light-emitting elements 61 are electrically connected together in series. However, this is only an example and should not be construed as limiting. Alternatively, the plurality of light-emitting elements 61 may also be electrically connected together in parallel or in series-parallel in combination. Optionally, the light source 6 may consist of a single light-emitting element 61 as well. Note that the plurality of light-emitting elements 61 that form the light source 6 do not have to be laser diodes but may also be any other type of solid-state light-emitting elements (semiconductor light-emitting elements) such as light-emitting diodes (LEDs), organic electroluminescent (OEL) elements.

(1.3) Optical Member

The optical member 7 includes a half mirror 71 as shown in FIG. 1. The half mirror 71 reflects, toward the first end 31 of the light guide member 3, the laser beam L1 emitted from the light source 6. In addition, the optical member 7 also condenses the laser beam L1 to make the condensed light beam L1 incident on the first end 31 of the light guide member 3. Optionally, the optical member 7 may include not only the half mirror 71 but also another mirror, a lens, and other optical elements. Meanwhile, the signal light L3 that has emerged through the first end 31 of the light guide member 3 is transmitted through the half mirror 71 of the optical member 7 to impinge on the photodetector 502.

The half mirror 71 has the capability of spatially separating the optical path of the laser beam L1 from that of the signal light L3. Specifically, the half mirror 71 may be implemented as a dichroic mirror that selectively transmits or reflects the incoming light according to the wavelength range thereof. In this embodiment, the half mirror 71 is configured to reflect the laser beam L1 and transmit the signal light L3. However, this is only an example and should not be construed as limiting. Alternatively, the half mirror 71 may also be configured to transmit the laser beam L1 and reflect the signal light L3.

(1.4) Driving Unit

The driving unit 501 is provided with an AC voltage from the AC power supply P1 and supplies the drive current I1 to the light source 6. Specifically, the driving unit 501 includes a power supply circuit 51 for converting the AC voltage into a DC voltage and outputting the drive current I1 and an output control circuit 52 for controlling the power supply circuit 51. The AC power supply P1 may be a commercial power supply with a nominal voltage of 100 V or 200 V and a frequency of 50 Hz or 60 Hz, for example.

The power supply circuit 51 is suitably a switching power supply circuit with power factor improvement capabilities. The switching power supply circuit may include an AC/DC converter circuit and a DC/DC converter circuit, for example. The AC/DC converter circuit is suitably implemented as a voltage step-up or step-down chopper circuit with power factor improvement capabilities. Among other things, the AC/DC converter circuit is suitably an insulating fly-back converter circuit. The DC/DC converter circuit is suitably a chopper circuit to be subjected to constant current control. If the voltage of the light source 6 is lower than the output voltage of the AC/DC converter circuit, a voltage step-down circuit such as a voltage step-down chopper circuit may be used as the DC/DC converter circuit. On the other hand, if the voltage of the light source 6 is higher than the output voltage of the AC/DC converter circuit, a voltage step-up circuit such as a voltage step-up chopper circuit may be used as the DC/DC converter circuit. Furthermore, if the voltage of the light source 6 is sometimes higher than, and sometimes lower than, the output voltage of the AC/DC converter circuit, then a voltage step-up/step-down circuit such as a voltage step-up/step-down chopper circuit may be used.

Optionally, the switching power supply circuit may also be implemented as a single-stage converter (SS converter). The SS converter is a converter of a single conversion type (where voltage conversion is performed only once) having the power factor improvement circuit capability and AC/DC converter capability.

The output control circuit 52 regulates the drive current I1 by controlling the power supply circuit 51. That is to say, the driving unit 501 has a dimming capability of controlling the light quantity (or light intensity) of the laser beam L1 by varying the drive current I1.

(1.5) Light Guide Member

The light guide member 3 may be implemented as an optical fiber and optically couples the light source device 2 and the light distributor 4 together. The light guide member 3 may have a core diameter of 400 μm, for example. However, this is only an example and should not be construed as limiting. The core diameter of the light guide member 3 may be equal to or less than 5 mm. On the first end 31 of the light guide member 3, incident is the laser beam L1 that has been emitted from the light source 6 and then condensed by the optical member 7. The laser beam L1 is incident on the first end 31 of the light guide member 3, transmitted through the inside of the light guide member 3, and emerges through the second end 32 of the light guide member 3.

(1.6) Light Distributor

The laser beam L1 that has emerged through the second end 32 of the light guide member 3 is incident on the light distributor 4. The light distributor 4 houses the wavelength converting member 41 inside a truncated conical light distributor body 42, of which the ends are both open.

The wavelength converting member 41 is a member in which a phosphor is added to a light-transmitting material. The phosphor may be a yellow phosphor, for example. The yellow phosphor may be either $Y_3Al_5O_{12}$ activated with Ce or $Ba_2SiO_4$ activated with Eu. The phosphor is excited by part of the blue laser beam L1 to radiate a yellow light beam. The wavelength converting member 41 produces, as a wavelength-converted light beam, white light as a mixture of the rest of the blue laser beam L1 and the yellow light beam. The light distributor 4 further includes at least one more optical element and controls the distribution of the white light produced by the wavelength converting member 41 such that most of the white light radiated from the light distributor 4 irradiates the lighting space as illuminating light beam L2.

Furthermore, part of the white light is incident, as the signal light L3, on the second end 32 of the light guide member 3. The signal light L3 incident on the second end 32 is transmitted through the inside of the light guide member 3 and emerges through the first end 31 of the light guide member 3.

(1.7) Photodetector

The photodetector 502 includes a light sensor 53 and a defect detecting unit 54.

The signal light L3 emerging through the first end 31 of the light guide member 3 is transmitted through the half mirror 71 of the optical member 7 to impinge on the light sensor 53. The light sensor 53 outputs an electrical signal Y1 representing the quantity of the signal light L3 received. That is to say, the light sensor 53 detects, as the signal light L3, the laser beam L1 that has been emitted from the light source 6, transmitted through the light guide member 3, and then reflected from the light distributor 4.

Figure 3:
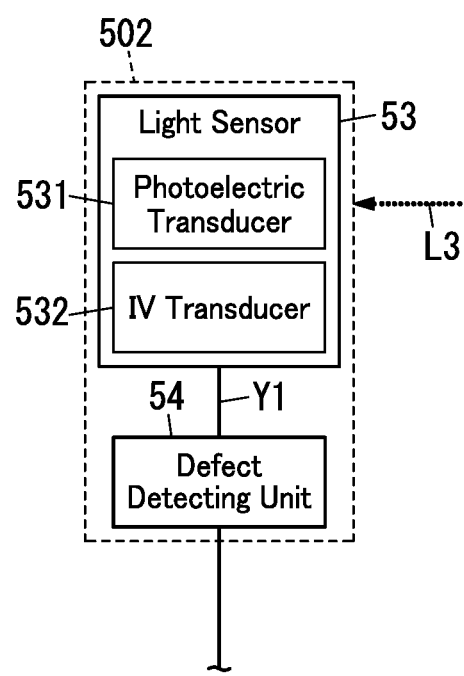
FIG. 3 is a block diagram illustrating a configuration for a photodetector of the lighting system according to the first embodiment.

As shown in FIG. 3, the light sensor 53 includes a photoelectric transducer 531 and a current-to-voltage transducer (hereinafter referred to as an "IV transducer") 532. The photoelectric transducer 531 may be implemented as a photosensitive element such as a photodiode and outputs a detected current corresponding to the quantity of the signal light L3 received. The IV transducer 532 includes a current amplifier, a resistor, and other components, amplifies the detected current, transforms the detected current thus amplified into a voltage, and then outputs the voltage thus transformed as an electrical signal Y1. That is to say, the electrical signal Y1 is a voltage signal. The larger the quantity of the signal light L3 is, the greater the value of the detected current is and the higher the voltage value of the electrical signal Y1 is. The light sensor 53 is electrically connected to the defect detecting unit 54. The electrical signal Y1 is output to the defect detecting unit 54.

On the optical path leading to the light sensor 53, provided is an optical filter which transmits the white light and attenuates light in the other colors. This allows the light sensor 53 to receive the white signal light L3 almost without receiving light other than the white signal light L3.

The defect detecting unit 54 receives the electrical signal Y1 to detect any defect in the lighting system 1. Examples of defects in the lighting system 1 include defects in the light guide member 3, defects in the light source 6 (light-emitting elements 61), and defects in the wavelength converting member 41. The output control circuit 52 controls the power supply circuit 51 based on a result of the defect detection.

(1.8) Controller

The output control circuit 52 and the defect detecting unit 54 may be implemented as a controller 503. The controller 503 may be at least one control integrated circuit (IC) or a computer system, whichever is appropriate.

The computer system may include, as a principal hardware component, a processor operating in accordance with a program. Any type of processor may be used herein without limitation, as long as the functions of the output control circuit 52 and the defect detecting unit 54 may be performed by making the processor execute the program. The processor may be made up of a single or a plurality of electronic circuits including a semiconductor integrated circuit (IC) or a largescale integrated circuit (LSI). As used herein, the "integrated circuit" such as an IC or an LSI is called by a different name depending on the degree of integration thereof. Examples of the integrated circuits include a system LSI, a very largescale integrated circuit (VLSI), and an ultra largescale integrated circuit (ULSI). Optionally, a field-programmable gate array (FPGA) to be programmed after an LSI has been fabricated or a reconfigurable logic device allowing the connections or circuit sections inside of an LSI to be reconfigured may also be adopted as the processor. Those electronic circuits may be either integrated together on a single chip or distributed on multiple chips, whichever is appropriate. Those multiple chips may be integrated together in a single device or distributed in multiple devices without limitation. The program may be stored in a computer-readable non-transitory storage medium such as a ROM, an optical disc, or a hard disk drive. The program may be stored in advance in such a non-transitory storage medium or may also be downloaded through a wide area communications network such as the Internet and recorded on a non-transitory storage medium.

The computer system performs the respective functions of the output control circuit 52 and the defect detecting unit 54 according to the present disclosure by making the processor execute the program.

(1.9) Feedback Control

Next, it will be described how this lighting system 1 operates.

First, when AC power is supplied from the AC power supply P1 to the lighting system 1, the output control circuit 52 controls the power supply circuit 51 to have the drive current I1 supplied to the light source 6. When supplied with the drive current I1, the plurality of light-emitting elements 61 of the light source 6 radiate a blue laser beam L1. The laser beam L1 is transmitted through the optical member 7 and the light guide member 3 to impinge on the wavelength converting member 41 of the light distributor 4. The wavelength converting member 41 produces white light (wavelength-converted light beam) based on the blue laser beam L1. Most of the white light emerges, from the light distributor 4, as an illuminating light beam L2 to irradiate the lighting space. Meanwhile, part of the white light is transmitted, as the signal light L3, through the light guide member 3 and the optical member 7 to impinge on the light sensor 53 of the photodetector 502.

The signal light L3 is the same white light as the illuminating light beam L2 that actually irradiates the lighting space and includes information about the quantity of the illuminating light beam L2. That is to say, the greater the quantity of the illuminating light beam L2 is, the larger the quantity of the signal light L3 is. Therefore, the larger the quantity of the illuminating light beam L2 is, the higher the voltage value of the electrical signal Y1 is. In other words, the smaller the quantity of the illuminating light beam L2 is, the lower the voltage value of the electrical signal Y1 is. That is to say, information about the quantity of the illuminating light beam L2 is fed back as the signal light L3 to the light source driver 5.

The output control circuit 52 monitors the quantity of the illuminating light beam L2 emitted from the light source 6 based on the voltage value of the electrical signal Y1. Then, the output control circuit 52 performs feedback control to bring the drive current I1 into conformity with a target current by controlling the power supply circuit 51 such that the voltage value of the electrical signal Y1 agrees with a target voltage value. The target voltage value may be a predetermined fixed value or a variable value corresponding to a light intensity control signal received from an external device. The output control circuit 52 is allowed to perform light intensity control by varying the target voltage value.

In the embodiment described above, the light sensor 53 is located closer to the first end 31 of the light guide member 3, while the wavelength converting member 41 is located closer to the second end 32 of the light guide member 3. That is to say, the light sensor 53 and the wavelength converting member 41 are located at mutually opposite ends of the light guide member 3. Thus, the laser beam L1 is incident on the first end 31, transmitted through the inside of the light guide member 3, and then emerges through the second end 32. Meanwhile, the signal light L3 is incident on the second end 32, transmitted through the inside of the light guide member 3, and then emerges through the first end 31. This allows the light sensor 53 to detect the condition of the illuminating light beam L2 (white light), produced away from the light sensor 53 with the light guide member 3 interposed, in the vicinity of the driving unit 501, not in the vicinity of the light distributor 4. Therefore, even if the total length of the light guide member 3 has increased, the light sensor 53 may be arranged near the driving unit 501 and the length of a signal line to transmit the electrical signal Y1 may be further shortened. Consequently, the lighting system 1, light source device 2, and light source driver 5 according to this embodiment each include the light sensor 53 and yet may have a simplified configuration.

(1.10) Defect Detection

The defect detecting unit 54 detects any defect in the lighting system 1 based on the electrical signal Y1. Examples of defects in the lighting system 1 include defects in the light guide member 3, defects in the wavelength converting member 41, and defects in the light source 6 (light-emitting elements 61). The output control circuit 52 controls the power supply circuit 51 based on the result of the defect detection.

The defect detecting unit 54 performs defect detection processing in an initial stage on and after the light source 6 has just been turned ON (including a point in time when the light source 6 is turned ON) and in a steady state in which the light source 6 is kept ON. The defect detecting unit 54 monitors the voltage value of the electrical signal Y1.

As used herein, defects in the light guide member 3 refer to, for example, the light guide member's 3 snapping or coming loose from the light source device 2 or the light distributor 4. When the light guide member 3 comes to have any of such defects, the signal light L3 may leak out of the snapped portion of the light guide member 3 or may even fail to be transmitted to the light source device 2. Therefore, when the light guide member 3 has such defects, the quantity of the signal light L3 impinging on the light sensor 53 decreases significantly compared to the normal condition. Consequently, when the light guide member 3 has any of such defects, the voltage value of the electrical signal Y1 is significantly lower than that of the electrical signal Y1 when the light guide member 3 is in normal condition.

Defects in the wavelength converting member 41 include the wavelength converting member's 41 damage, chipping, peeling, and falling off. When the wavelength converting member 41 comes to have any of such defects, the quantity of the signal light L3 incident on the second end 32 of the light guide member 3 decreases significantly compared to the normal condition. Consequently, when the wavelength converting member 41 has any of such defects, the voltage value of the electrical signal Y1 is significantly lower than that of the electrical signal Y1 when the wavelength converting member 41 is in normal condition.

Defects in the light source 6 include not only a failure that prevents the light-emitting elements 61 from emitting the laser beam L1 due to no drive current I1 flowing through the light-emitting elements 61 but also an oscillation failure that prevents the light-emitting elements 61 from emitting the laser beam L1 due to some problem with the oscillation operation by the light-emitting elements 61 although the drive current I1 does flow through the light-emitting elements 61. Also, as used herein, the state where the light-emitting elements 61 are prevented from emitting the laser beam refers to not only a situation where the light-emitting elements 61 emit no laser beams L1 at all but also a situation where the light-emitting elements 61 emits unexpected light other than the laser beam L1. Such a defect in the light source 6 is caused by a defect in at least one of the plurality of light-emitting elements 61. When the light source 6 has such a defect, the quantity of the signal light L3 emerging through the first end 31 of the light guide member 3 is significantly lower than in normal condition. Nevertheless, when the light source 6 goes defective, chances of all of those light-emitting elements 61 going out of order are slim and only some of those light-emitting elements 61 are likely to have such a defect. For example, if the light source 6 consists of four light-emitting elements 61, the chances of only one or two of the four light-emitting elements 61 going defective are relatively high.

Therefore, when the light guide member 3, the wavelength converting member 41, or the light source 6 has defects, the voltage value of the electrical signal Y1 becomes lower than that of the electrical signal Y1 in normal condition. However, as described above, the voltage value of the electrical signal Y1 when the light guide member 3 or the wavelength converting member 41 has defects is lower than that of the electrical signal Y1 when the light source 6 has defects. That is to say, if the ratio of the magnitude of decrease in voltage value to the voltage value of the electrical signal Y1 in normal condition (hereinafter referred to as a "normal value") is hereinafter referred to as a "ratio of decrease," then the ratio of decrease when the light source 6 has defects becomes lower than the ratio of decrease when either the light guide member 3 or the wavelength converting member 41 has defects.

Figure 4A:
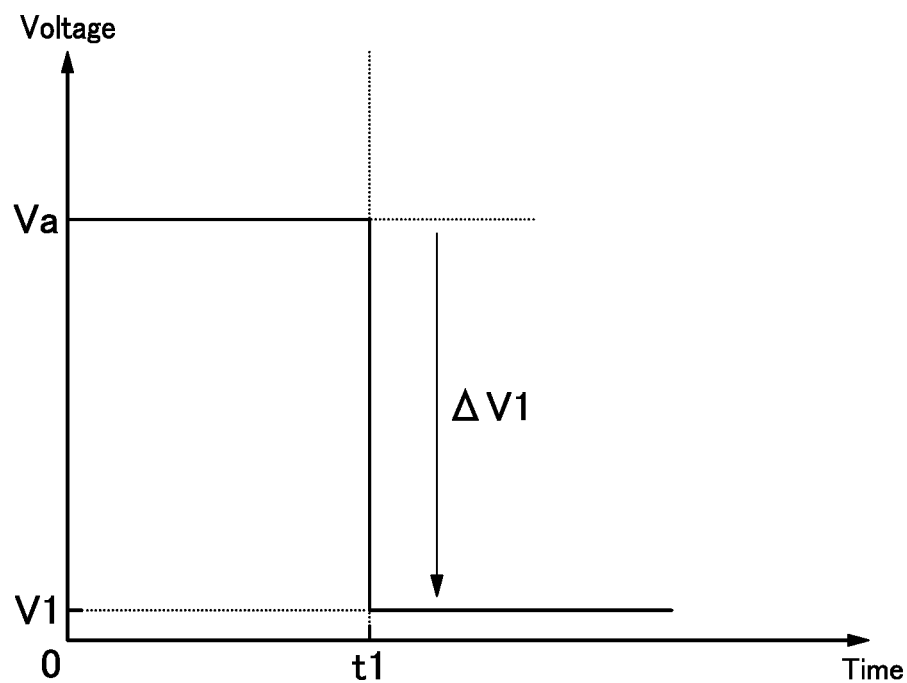
FIG. 4A is a waveform diagram illustrating how the lighting system according to the first embodiment may operate.
Figure 4B:
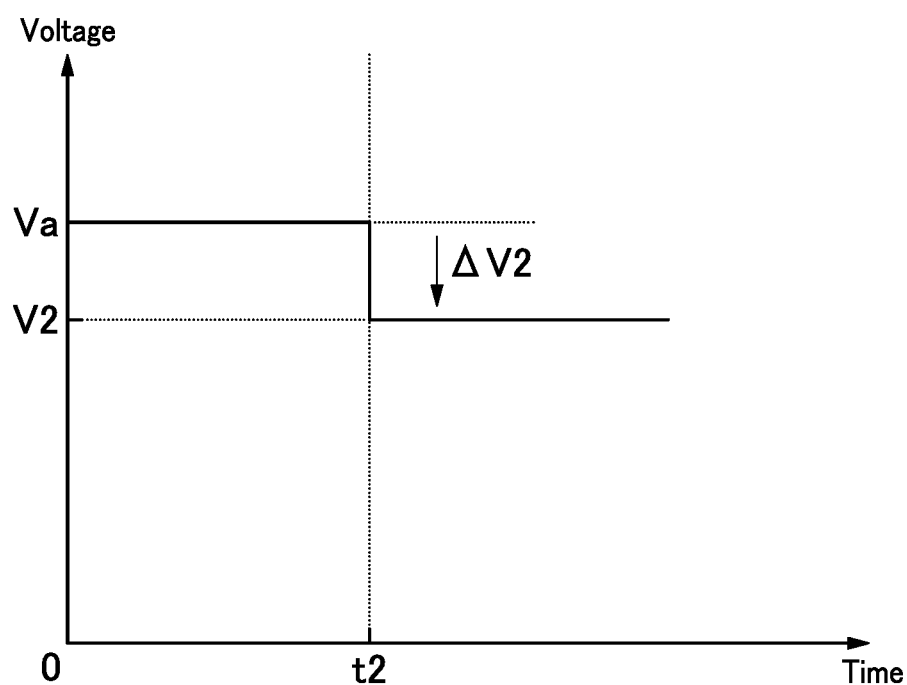
FIG. 4B is a waveform diagram illustrating how the lighting system according to the first embodiment may also operate.

Specifically, FIG. 4A shows how the voltage waveform of the electrical signal Y1 changes before and after either the light guide member 3 or the wavelength converting member 41 goes defective. Before a time t1 when either the light guide member 3 or the wavelength converting member 41 goes defective, the voltage value of the electrical signal Y1 is a normal value Va. When the light guide member 3 or the wavelength converting member 41 goes defective at the time t1, the voltage value of the electrical signal Y1 decreases from the normal value Va by the magnitude of decrease ΔV1 to turn into an abnormal value V1. In this case, the ratio of decrease R1 of the voltage value is ΔV1/Va. On the other hand, FIG. 4B shows how the voltage waveform of the electrical signal Y1 changes before and after the light source 6 goes defective. Before a time t2 when the light source 6 goes defective, the voltage value of the electrical signal Y1 is a normal value Va. When the light source 6 goes defective at the time t2, the voltage value of the electrical signal Y1 decreases from the normal value Va by the magnitude of decrease ΔV2 to turn into an abnormal value V2. In this case, the ratio of decrease R2 of the voltage value is ΔV2/Va. The magnitude of decrease ΔV2 is smaller than the magnitude of decrease ΔV1, and the ratio of decrease R2 is less than the ratio of decrease R1. In this embodiment, the ratio of decrease R1 is supposed to be more than 50% and the ratio of decrease R2 is supposed to be equal to or less than 50%. For example, if the light source 6 consists of four light-emitting elements 61, one light-emitting element 61 going defective makes the ratio of decrease R2 25%, and two light-emitting elements 61 going defective makes the ratio of decrease R2 50%.

The defect detecting unit 54 periodically calculates the ratio of decrease in the voltage value of the electrical signal Y1. The defect detecting unit 54 is able to learn the light intensity control level of the light source 6 based on a light intensity control signal received from an external device and read data about the normal value Va, corresponding to the light intensity control level, from a data table stored in advance in a memory, for example. The higher the light intensity level is, the larger the normal value Va becomes. The defect detecting unit 54 calculates the ratio of decrease based on the voltage value of the electrical signal Y1 and the normal value Va.

In addition, the defect detecting unit 54 stores, in a memory or any other storage in advance, data about a first threshold value with respect to the ratio of decrease for use to determine whether or not there is any defect and a second threshold value with respect to the ratio of decrease for use to distinguish a defect in the light guide member 3 or the wavelength converting member 41 from a defect in the light source 6. The first threshold value is less than the second threshold value. When finding the ratio of decrease equal to or greater than the first threshold value, the defect detecting unit 54 determines that there should be some defect and compares the ratio of decrease with the second threshold value. When finding the ratio of decrease equal to or less than the second threshold value, the defect detecting unit 54 detects a defect in the light source 6. On the other hand, when finding the ratio of decrease greater than the second threshold value, the defect detecting unit 54 detects a defect in the light guide member 3 or the wavelength converting member 41. For example, the first threshold value is set at a value falling within the range from about a few % to about 10%, and the second threshold value is set at a value of about 50%.

This allows the defect detecting unit 54 to detect, based on the voltage value of the electrical signal Y1, defects in the light guide member 3 or the wavelength converting member 41, and defects in the light source 6 (light-emitting elements 61). Then, the defect detecting unit 54 passes the result of defect detection to the output control circuit 52.

The output control circuit 52 controls the power supply circuit 51 based on the result of defect detection to reduce the drive current I1 when any defect is detected. For example, when any defect is detected in either the light guide member 3 or the wavelength converting member 41, the output control circuit 52 decreases the drive current I1 to zero to make the light source 6 stop emitting the laser beam L1. For example, when any defect is detected in (any light-emitting element 61 of) the light source 6, the output control circuit 52 decreases the drive current I1 to reduce the quantity of the laser beam L1 emitted from the light source 6. Alternatively, when a defect is detected in any of the light guide member 3, the wavelength converting member 41, or the light source 6, the output control circuit 52 may decrease the drive current I1 to zero to make the light source 6 stop emitting the laser beam L1.

Still alternatively, when a defect is detected in any of the light guide member 3, the wavelength converting member 41, or the light source 6, the output control circuit 52 may output the drive current I1 intermittently to blink the laser beam L1. In that case, changing the blinking pattern according to the type of the defect detected allows the output control circuit 52 to notify a person around the lighting system whether the defect has been detected in the light guide member 3 or the wavelength converting member 41 or the light source 6.

As can be seen, when detecting any defect, the light source device 2 is able to reduce the quantity of the laser beam L1 emitted, blink the laser beam L1, or stop outputting the laser beam L1. In addition, reducing the quantity of the laser beam L1 emitted, blinking the laser beam L1, or stopping outputting the laser beam L1 causes the illuminating light beam L2 to be turned down, blinked, or turned OFF, thus notifying the person around the lighting system 1 of the abnormal condition.

(1.11) First Variation

Figure 5:
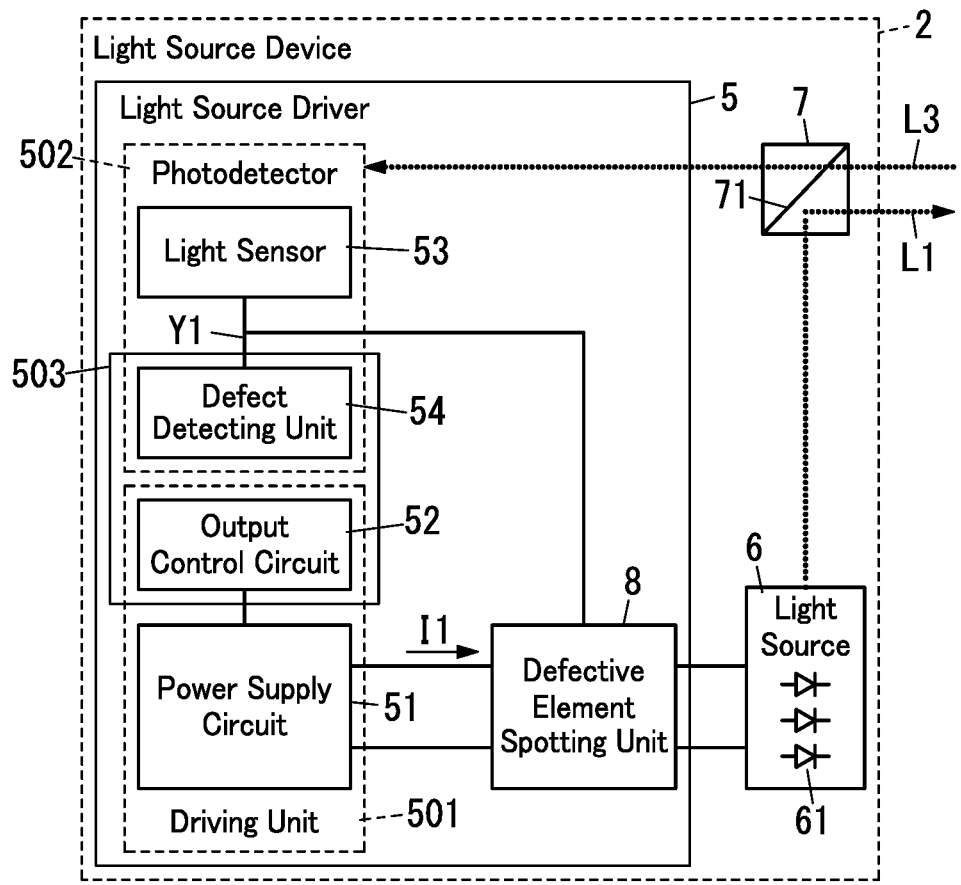
FIG. 5 is a block diagram illustrating a configuration for a light source device according to a first variation of the first embodiment.

FIG. 5 illustrates a configuration for a light source device 2 according to a first variation of the first embodiment. The light source driver 5 of the light source device 2 according to this variation further includes a defective element spotting unit 8, which is a major difference from the first embodiment described above. In the following description, any constituent element of this first variation, having the same function as a counterpart of the first embodiment described above, will be designated by the same reference sign as that counterpart's, and description thereof will be omitted herein.

Figure 6:
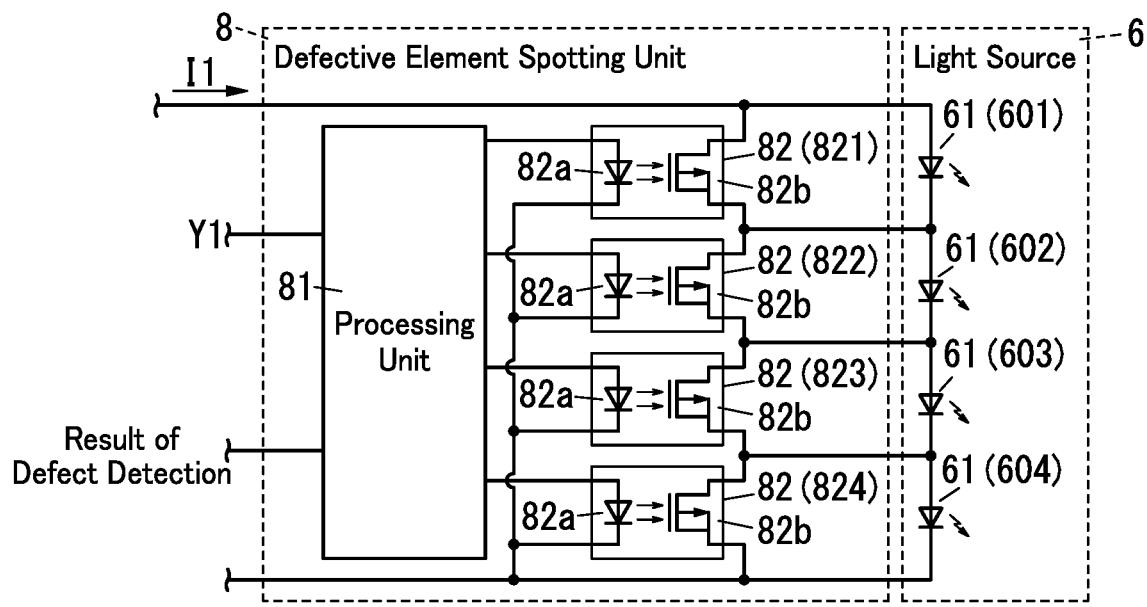
FIG. 6 is a circuit diagram illustrating a configuration for a defective element spotting unit according to the first variation of the first embodiment.

As shown in FIG. 5, the defective element spotting unit 8 is provided between the power supply circuit 51 and the light source 6. As shown in FIG. 6, the defective element spotting unit 8 includes a processing unit 81 and a plurality of (e.g., four in the example illustrated in FIG. 6) switches 82. The defective element spotting unit 8 spots any defective light-emitting element 61 among the plurality of light-emitting elements 61.

(1.11.1) Switch

The plurality of switches 82 are connected in parallel with each other to the plurality of light-emitting elements 61. Each of these switches 82 is implemented as a semiconductor relay (i.e., a solid-state relay), for example, and includes a light-emitting diode 82a serving as a light-emitting element and a phototransistor 82b serving as a photosensitive element. The respective phototransistors 82b of the plurality of switches 82 are connected together in series between the output terminals of the power supply circuit 51. In addition, in each of the switches 82, the light-emitting diode 82a thereof is connected to the processing unit 81 and the phototransistor 82b is connected in parallel with an associated one of the light-emitting elements 61. The light-emitting diode 82a has its anode electrically connected to the processing unit 81 and has its cathode electrically connected to the output terminal with the lower voltage of the power supply circuit 51. Under the control of the processing unit 81 with respect to the associated light-emitting diode 82a, each switch 82 turns ON and OFF the associated phototransistor 82b. In the following description, turning ON and OFF the phototransistor 82b will be hereinafter referred to as turning ON and OFF the switch 82.

The plurality of switches 82 are associated one to one with, and connected together in parallel with, the plurality of light-emitting elements 61. In the example illustrated in FIG. 6, the plurality of light-emitting elements 61 consists of a first light-emitting element 601, a second light-emitting element 602, a third light-emitting element 603, and a fourth light-emitting element 604. The plurality of switches 82 consists of a first switch 821, a second switch 822, a third switch 823, and a fourth switch 824. The first, second, third, and fourth switches 821, 822, 823, and 824 are associated with the first, second, third, and fourth light-emitting elements 601, 602, 603, and 604, respectively.

In each switch 82, while the phototransistor 82b is in OFF state, the drive current I1 flows through its associated light-emitting element 61. On the other hand, while the phototransistor 82b is in ON state, both terminals of the associated light-emitting element 61 are short-circuited together, and therefore, no drive current I1 flows through the associated light-emitting element 61. For example, while the phototransistor 82b of the first switch 821 is in OFF state, a drive current I1 flows through the first light-emitting element 601. On the other hand, while the phototransistor 82b of the first switch 821 is in ON state, no drive current I1 flows through the first light-emitting element 601. The same relation between the first switch 821 and the first light-emitting element 601 is also applicable to between the second switch 822 and the second light-emitting element 602, between the third switch 823 and the third light-emitting element 603, and between the fourth switch 824 and the fourth light-emitting element 604.

(1.11.2) Processing Unit

The processing unit 81 may be implemented as a microcontroller, for example, and controls the plurality of switches 82. More specifically, the processing unit 81 controls the supply of a current to each of the plurality of light-emitting elements 61 by controlling the ON/OFF states of the plurality of switches 82 on an individual basis.

When the defect detecting unit 54 detects any defect in the light source 6, the processing unit 81 turns one of the plurality of switches 82 after another from OFF to ON sequentially for a predetermined amount of time. The processing unit 81 monitors, based on the electrical signal Y1, a variation in the quantity of the signal light L3 received by the light sensor 53. If the quantity of the signal light L3 does not change (i.e., unless the voltage value of the electrical signal Y1 decreases) when the switch 82 is turned ON, the processing unit 81 determines the light-emitting element 61 associated with the switch 82 that has been turned ON to be defective. This decision will be described in further detail below.

When the defect detecting unit 54 detects any defect in the light source 6, the processing unit 81 turns ON one of the plurality of switches 82 after another sequentially for a predetermined amount of time to monitor the voltage value of the electrical signal Y1. If the light-emitting element 61 associated with the switch 82 in ON state is normal, then the light-emitting element 61 stops emitting the laser beam. Thus, the quantity of the laser beam L1 emitted from the light source 6 decreases, the quantity of the signal light L3 also decreases, and the voltage value of the electrical signal Y1 falls. Meanwhile, the defective light-emitting element 61 does not emit a laser beam, no matter whether its associated switch 82 is ON or OFF. Thus, before and after the switch 82 associated with the defective light-emitting element 61 turns ON, the quantity of the laser beam L1 does not change. Therefore, the quantity of the signal light L3 does not change, either. Nor does the voltage value of the electrical signal Y1. That is why the processing unit 81 determines such a light-emitting element 61, for which the voltage value of the electrical signal Y1 does not change before and after the switch 82 turns ON, to be a defective light-emitting element 61.

As can be seen, a defective light-emitting element 61 may be spotted among the plurality of light-emitting elements 61 by sequentially turning ON one of the plurality of switches 82 associated with the plurality of light-emitting elements 61 after another to monitor the voltage value of the electrical signal Y1.

In this variation, when finding the variation in the voltage value of the electrical signal Y1 before and after the switch 82 turns ON to be equal to or less than a third threshold value, the processing unit 81 determines the associated light-emitting element 61 to be defective. Data about the third threshold value is stored in advance in a memory or any other storage, for example.

Furthermore, when detecting a defect in any one of the light-emitting elements 61, the processing unit 81 turns ON the switch 82 associated with the defective light-emitting element 61 to short-circuit both terminals of the defective light-emitting element 61 together. For example, when detecting a defect in the second light-emitting element 602, the processing unit 81 turns ON the switch 82 associated with the second light-emitting element 602 to short-circuit both terminals of the second light-emitting element 602 together. The drive current I1 flows through the first light-emitting element 601, the phototransistor 82b of the second switch 822, the third light-emitting element 603, and the fourth light-emitting element 604. That is to say, the drive current I1 does not flow through the second light-emitting element 602.

This allows the lighting system 1 to continue operating normally with the defective light-emitting element 61 turned OFF among the plurality of light-emitting elements 61, i.e., with the defective light-emitting element 61 electrically removed from the plurality of light-emitting elements 61. In addition, this also allows a person around the lighting system 1 to be notified what light-emitting element 61 is defective among the plurality of light-emitting elements 61. Furthermore, since the drive current I1 stops flowing through the defective light-emitting element 61, the heat generated by the defective light-emitting element 61 is reducible.

(1.12) Second Variation

The light sensor 53 does not have to be implemented as a photodiode but may also be any other type of photosensitive element as well. For example, the light sensor 53 may be a phototransistor, a solar cell, or a CdS cell.

The light-emitting element 61 may radiate a laser beam L1 in any color other than blue. The wavelength converting member 41 may have light in any color other than yellow emerge from itself based on the laser beam L1 received. Furthermore, the wavelength-converted light does not have to be white light. Furthermore, the light emitted from the light-emitting elements 61 does not have to be a laser beam.

The power supply circuit 51 does not have to have any particular circuit configuration as long as the power supply circuit 51 may output a DC drive current I1.

Each of these variations is also able to achieve the same advantages as the ones of the first embodiment described above.

Second Embodiment (2.1) Overall Configuration for Lighting System

Next, an overall configuration for a lighting system 1A according to a second embodiment of the present disclosure will be described with reference to the accompanying drawings. In the following description, any constituent element of this second embodiment, having the same function as a counterpart of the first embodiment described above, will be designated by a combination of the same reference sign as that counterpart's and "A" added as a suffix to the end of the reference sign.

Figure 7:
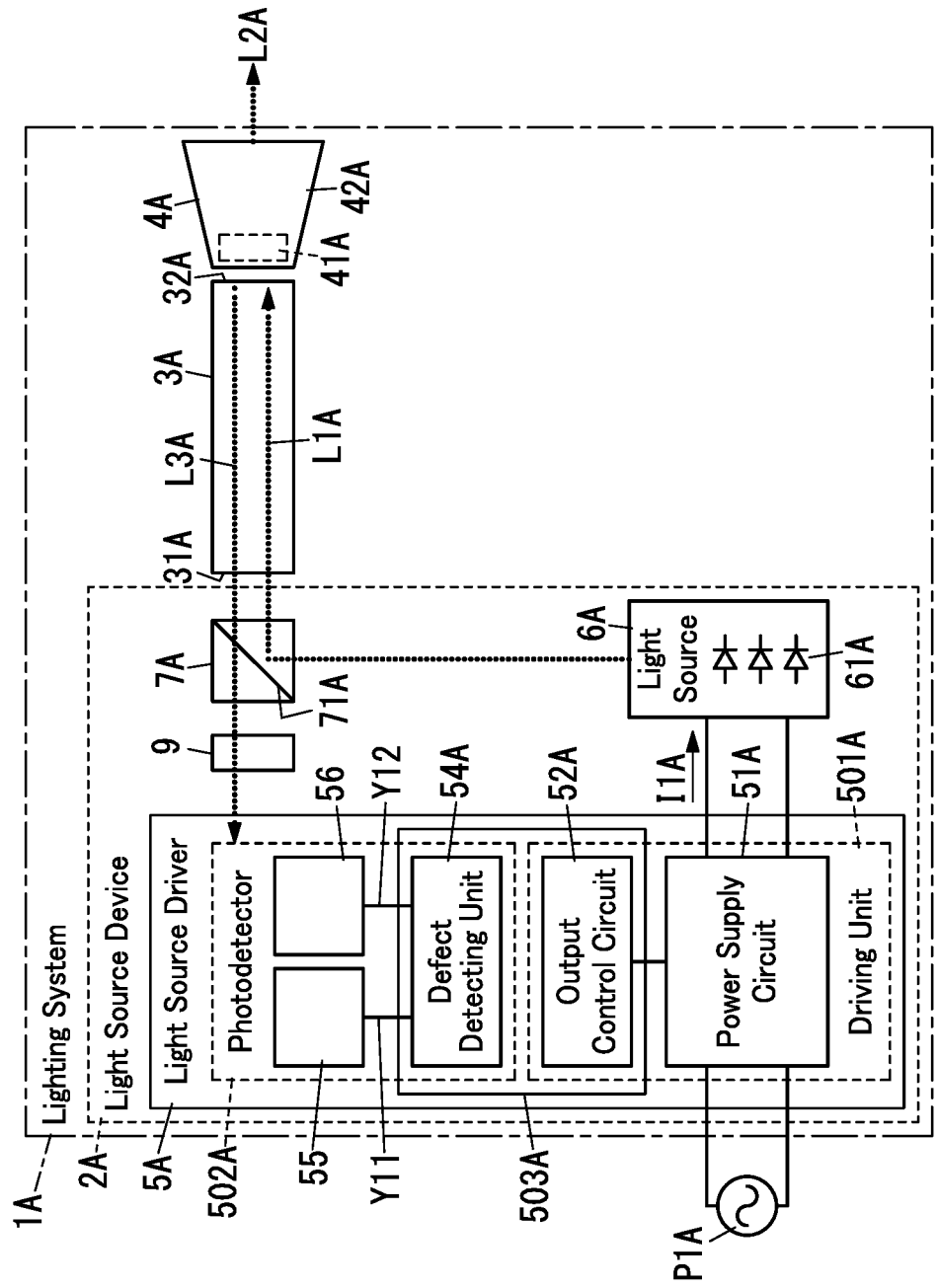
FIG. 7 is a block diagram illustrating a configuration for a lighting system including a photodetector according to a second embodiment.

As shown in FIG. 7, the lighting system 1A includes a light source device 2A, a light guide member 3A, and a light distributor 4A. The light source device 2A radiates a laser beam L1A. The laser beam L1A is incident on a first end 31A of the light guide member 3A, passes through the inside of the light guide member 3A, and then emerges through a second end 32A of the light guide member 3A. The laser beam L1A emerging through the second end 32A is converted by a wavelength converting member 41A of the light distributor 4A into a wavelength-converted light beam. Most of the wavelength-converted light beam emerges from the light distributor 4A as an illuminating light beam L2A to irradiate a lighting space. Meanwhile, part of the wavelength-converted light beam is incident as signal light L3A on the second end 32A of the light guide member 3A. The signal light L3A passes through the inside of the light guide member 3A and emerges through the first end 31A of the light guide member 3A.

The light source device 2A includes a light source driver 5A, a light source 6A, an optical member 7A, and a condenser lens 9. The light source driver 5A lights (i.e., turns ON) the light source 6A by supplying a DC drive current I1A to the light source 6A. When supplied with the drive current I1A, the light source 6A radiates the laser beam L1A. The laser beam L1A emitted from the light source 6A is incident on the first end 31A of the light guide member 3A through the optical member 7A. The housing 2a shown in FIG. 2 houses the light source driver 5A, the light source 6A, the optical member 7A, and the condense lens 9. The light source device 2A is used along with the light guide member 3A and the light distributor 4A.

The light source driver 5A includes a driving unit 501A and a photodetector 502A. The driving unit 501A is provided with an AC voltage by an AC power supply P1A and supplies a drive current I1A to the light source 6A. The photodetector 502A detects the signal light L3A that has emerged through the first end 31A of the light guide member 3A. The signal light L3A has been incident on the second end 32A of the light guide member 3A, passed through the inside of the light guide member 3A, and then emerged through the first end 31A of the light guide member 3A.

An output control circuit 52A and a defect detecting unit 54A may be implemented as a controller 503A. The controller 503A may be implemented as at least one control IC or a computer system, whichever is appropriate. The computer system performs the respective functions of the output control circuit 52A and the defect detecting unit 54A of the present disclosure by making a processor execute a program.

This lighting system 1A may be used as, for example, an underwater lighting for radiating light under the water or a headlight for automobiles.

(2.2) Condenser Lens

The condenser lens 9 is arranged between the optical member 7A and the photodetector 502A. The condenser lens 9 is a condensing member for converging the signal light L3A that has been transmitted through the half mirror 71A of the optical member 7A to irradiate the photodetector 502A with the converged signal light L3A.

The condenser lens 9 suitably has, as well as the condensing function described above, the function of an optical filter for transmitting white light and attenuating non-white light. The optical filter function of the condenser lens 9 allows the photodetector 502A to receive the white signal light L3A almost without receiving any light other than the white signal light L3A.

(2.3) Photodetector

The photodetector 502A includes a first light sensor 55, a second light sensor 56, and a defect detecting unit 54A.

The signal light L3A emerging through the first end 31A of the light guide member 3A is transmitted through the half mirror 71A of the optical member 7A and the condenser lens 9 to impinge on the first light sensor 55 and the second light sensor 56. The first light sensor 55 outputs an electrical signal Y11 representing the quantity of the signal light L3A received. The second light sensor 56 outputs an electrical signal Y12 representing the quantity of the signal light L3A received. That is to say, the first light sensor 55 and the second light sensor 56 each detect, as the signal light L3A, the laser beam L1A that has been emitted from the light source 6A, transmitted through the light guide member 3A, and then reflected from the light distributor 4A.

As shown in FIG. 8, the first light sensor 55 includes a photoelectric transducer 551 and an amplification unit 552. The photoelectric transducer 551 may be implemented as a photosensitive element such as a photodiode and outputs a detected current corresponding to the quantity of the signal light L3A received. The amplification unit 552 includes a current amplifier, a resistor, and other components, amplifies the detected current, transforms the detected current thus amplified into a voltage, and then outputs the voltage thus transformed as the first electrical signal Y11. That is to say, the first electrical signal Y11 is a voltage signal. The first light sensor 55 is electrically connected to the defect detecting unit 54A. The first electrical signal Y11 is output to the defect detecting unit 54A.

Figure 9A:
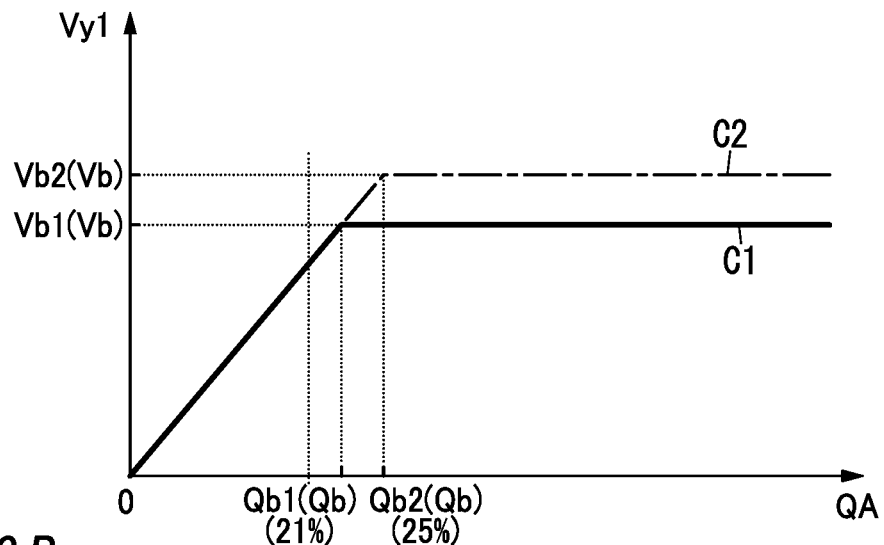
FIG. 9A is a graph showing the output characteristic of a first light sensor of the photodetector according to the second embodiment.

FIG. 9A shows the output characteristic of the first light sensor 55 and illustrates how a first voltage value Vy1, which is a voltage value of the first electrical signal Y11, changes with the quantity QA of the signal light L3A. As the quantity QA of the signal light L3A increases from zero, the first voltage value Vy1 also increases linearly. When the quantity QA of the signal light L3A exceeds a saturated light quantity Qb, the first voltage value Vy1 becomes constant at a saturated voltage value Vb. That is to say, the amplification unit 552 serves as an analog amplifier. While the light quantity QA falls within the range from 0 to Qb, the first light sensor 55 operates in a linear range in which the first voltage value Vy1 is proportional to the light quantity QA. That is to say, the larger the light quantity QA is, the higher the first voltage value Vy1 becomes. However, once the light quantity QA has exceeded the saturated light quantity Qb, the first light sensor 55 operates in a saturated range where the output of the first light sensor 55 is saturated, and the first voltage value Vy1 plateaus (becomes constant) at the saturated voltage value Vb. Making the first light sensor 55 operate in not only the linear range but also the saturated range in this manner allows the dynamic range of the quantity QA of the signal light L3A to be broadened. FIG. 9A illustrates a minimum saturated light quantity Qb1 and a standard saturated light quantity Qb2 as exemplary saturated light quantities Qb, and also illustrates a minimum saturated voltage value Vb1 and a standard saturated voltage value Vb2 as exemplary saturated voltage values Vb. The minimum saturated light quantity Qb1, the standard saturated light quantity Qb2, the minimum saturated voltage value Vb1, and the standard voltage value Vb2 will be described in detail later in the "(2.4.1) Defect detection" section.

As shown in FIG. 8, the second light sensor 56 includes a photoelectric transducer 561 and an amplification unit 562. The photoelectric transducer 561 may be implemented as a photosensitive element such as a photodiode and outputs a detected current corresponding to the quantity of the signal light L3A received. The amplification unit 562 includes a current amplifier, a resistor, and other components, amplifies the detected current, transforms the detected current thus amplified into a voltage, and then outputs the voltage thus transformed as the second electrical signal Y12. That is to say, the second electrical signal Y12 is a voltage signal. The second light sensor 56 is electrically connected to the defect detecting unit 54A. The second electrical signal Y12 is output to the defect detecting unit 54A.

Figure 9B:
FIG. 9B is a graph showing the output characteristic of a second light sensor of the photodetector according to the second embodiment.

FIG. 9B shows the output characteristic of the second light sensor 56 and illustrates how the second voltage value Vy2 as the voltage value of the second electrical signal Y12 changes with the light quantity QA as the quantity of the signal light L3A. When the light quantity QA is equal to or greater than zero and less than a threshold value Qc, the second voltage value Vy2 is L (low) level (corresponding to "zero" state). On the other hand, when the light quantity QA is equal to or greater than the threshold value Qc, the second voltage value Vy2 is H (High) level (corresponding to "one" state). That is to say, the amplification unit 562 serves as a comparator, and changes the second voltage value Vy2 into one of the two values (H, L) (i.e., one or zero) depending on whether the light quantity QA is equal to or greater than the threshold value Qc.

The defect detecting unit 54A receives the first electrical signal Y11 and the second electrical signal Y12 and performs defect detection processing for determining whether or not there is any defect in the lighting system 1A. Examples of defects in the lighting system 1A include defects in the light guide member 3A and defects in the first light sensor 55. When finding no defects, the defect detecting unit 54A generates a lighting enable signal.

On receiving the lighting enable signal from the defect detecting unit 54A, the output control circuit 52A drives the power supply circuit 51A to radiate the laser beam L1A. On the other hand, when receiving no lighting enable signals from the defect detecting unit 54A, the output control circuit 52A deactivates the power supply circuit 51A to stop radiating the laser beam L1A. That is to say, the output control circuit 52A is enabled to radiate the laser beam L1A (i.e., to drive the power supply circuit 51A) when receiving the lighting enable signal but disabled from radiating the laser beam L1A (i.e., driving the power supply circuit 51A) when receiving no lighting enable signals.

(2.4) Lighting Control

Next, it will be described how the controller 503A performs lighting control.

First, when AC power is supplied from the AC power supply P1A to the lighting system 1A, the output control circuit 52A controls and drives the power supply circuit 51A to have the drive current I1A supplied to the light source 6A. When supplied with the drive current I1A, the plurality of light-emitting elements 61A of the light source 6A radiate a blue laser beam L1A. The laser beam L1A is transmitted through the optical member 7A and the light guide member 3A to impinge on the wavelength converting member 41A of the light distributor 4A. The wavelength converting member 41A produces white light (wavelength-converted light beam) based on the blue laser beam L1A. Most of the white light emerges, from the light distributor 4A, as an illuminating light beam L2A to irradiate the lighting space. Meanwhile, part of the white light is transmitted, as the signal light L3A, through the light guide member 3A, the optical member 7A and the condenser lens 9 to impinge on the first light sensor 55 and the second light sensor 56 of the photodetector 502A.

The signal light L3A is the same white light as the illuminating light beam L2A that actually irradiates the lighting space and includes information about the quantity of the illuminating light beam L2A. That is to say, the greater the quantity of the illuminating light beam L2A is, the larger the quantity QA of the signal light L3A is. That is to say, information about the quantity of the illuminating light beam L2A is fed back as the signal light L3A to the light source driver 5A.

The defect detecting unit 54A performs defect detection processing based on the first electrical signal Y11 and the second electrical signal Y12. The output control circuit 52A controls the power supply circuit 51A based on the result of the defect detection processing.

(2.4.1) Defect Detection

The defect detecting unit 54A performs defect detection processing in an initial stage on and after the light source 6A has just been turned ON (including a point in time when the light source 6A is turned ON) and in a steady state in which the light source 6A is kept ON. The defect detecting unit 54A monitors the respective voltage values Vy1 and Vy2 of the first and second electrical signals Y11 and Y12, thereby detecting any defects in the light guide member 3A and the first light sensor 55.

As used herein, defects in the light guide member 3A refer to, for example, the light guide member's 3A snapping or coming loose from the light source device 2A or the light distributor 4A. When the light guide member 3A comes to have any of such defects, the signal light L3A may leak out of the snapped portion of the light guide member 3A or may even fail to be transmitted to the light source device 2A. Therefore, when the light guide member 3A goes defective, the quantity QA of the signal light L3A decreases significantly compared to the normal condition. Consequently, when the light guide member 3A has any of such defects, the first voltage value Vy1 is significantly lower than the first voltage value Vy1 when the light guide member 3A is in normal condition.

Thus, the controller 503A stores data about the first voltage value Vy1 in normal condition (hereinafter referred to as a "first normal voltage value") in advance in a memory, for example, on a dimming level basis. The defect detecting unit 54A reads data about the first normal voltage value corresponding to the current dimming level from the memory and compares the first voltage value Vy1 with the first normal voltage value. When finding the first voltage value Vy1 to be 50% or less of the first normal voltage value, the defect detecting unit 54A detects a defect in the light guide member 3A. In the following description, the decrease in the first voltage value Vy1 to 50% or less of the first normal voltage value will be sometimes hereinafter referred to as "50% down" of the first voltage value Vy1.

Nevertheless, due to the electrostatic breakdown, a failure mode or any other abnormal condition of the first light sensor 55, for example, the first voltage value Vy1 of the first electrical signal Y11 may sometimes be fixed at a saturated voltage value Vb irrespective of the magnitude of the light quantity QA. When the first voltage value Vy1 is fixed at the saturated voltage value Vb, the defect detecting unit 54A is unable to detect any defects in the light guide member 3A. Thus, the defect detecting unit 54A detects, based on both of the first electrical signal Y11 and the second electrical signal Y12, the electrostatic breakdown, failure mode, and other abnormal condition of the first light sensor 55 as defects of the first light sensor 55.

Specifically, if the light quantity QA of the signal light L3A is small enough for the first light sensor 55 in normal condition to operate in the linear range but the first voltage value Vy1 is still equal to the saturated voltage value Vb, then some defects may have been produced in the first light sensor 55. Thus, when finding the first voltage value Vy1 of the first electrical signal Y11 to be equal to or greater than the saturated voltage value Vb and the second voltage value Vy2 of the second electrical signal Y12 to be equal to or less than the L level, the defect detecting unit 54A determines that some defects have been produced in the first light sensor 55.

Thus, the threshold value Qc may be set as shown in FIGS. 9A and 9B.

First of all, the saturated voltage value Vb varies from one first light sensor 55 to another on an individual basis. In FIG. 9A, the output characteristic of the first light sensor 55 in which the saturated voltage value Vb is the minimum saturated voltage value Vb1 is designated by the reference sign C1, and the output characteristic of the first light sensor 55 in which the saturated voltage value Vb is the standard saturated voltage value Vb2 is designated by the reference sign C2. The minimum saturated voltage value Vb1 and the standard saturated voltage value Vb2 satisfy the inequality Vb1<Vb2. Also, supposing a saturated light quantity Qb corresponding to the minimum saturated voltage value Vb1 will be hereinafter referred to as a "minimum saturated light quantity Qb1" and a saturated light quantity Qb corresponding to the standard saturated voltage value Vb2 will be hereinafter referred to as a "standard saturated light quantity Qb2," the minimum saturated light quantity Qb1 and the standard saturated light quantity Qb2 satisfy the inequality Qb1<Qb2. Note that in FIGS. 9A and 9B, the saturated light quantity Qb is represented as the ratio of the light quantity QA to the maximum value.

Specifically, if the dispersion in the supply voltage for the first light sensor 55 is ±2%, the dispersion in the saturated voltage of the photoelectric transducer 551 falls within the range from −13% to 0%, and the AD conversion precision of the first voltage value Vy1 is ±0.15 V, the minimum saturated voltage value Vb1 is given by the following Equation (1) and the minimum saturated light quantity Qb1 is given by the following Equation (2). The threshold value Qc is set at a value slightly smaller than the minimum saturated light quantity Qb1. That is to say, the threshold value Qc is set at a value less than the minimum saturated light quantity Qb1 with the dispersion in saturated light quantity Qb taken into account.

$$Vb1=Vb2\cdot(4.11/5) \quad (1)$$

$$Qb1=Qb2\cdot(21/25) \quad (2)$$

For example, if the standard saturated voltage value Vb2 is 5V, then the minimum saturated voltage value Vb1 is calculated 4.11 V by Equation (1). If the standard saturated light quantity Qb2 is 25%, then the minimum saturated light quantity Qb1 is calculated 21% by Equation (2). The threshold value Qc is set at 20%, which is slightly smaller than 21% that is the minimum saturated light quantity Qb1. In that case, the correspondence between the light guide member 3A, the first light sensor 55, the second light sensor 56, and the light quantity QA and the first voltage value Vy1 and the second voltage value Vy2 is one of the following first through sixteenth modes. Note that the due to some defects such as electrostatic breakdown and failure mode, in the second light sensor 56, the second voltage value Vy2 of the second electrical signal Y12 may be sometimes fixed at H level irrespective of the magnitude of the light quantity QA.

(First mode): if the light guide member 3A is normal, the first light sensor 55 is normal, the second light sensor 56 is normal, and the light quantity QA is 20% or more, then the first voltage value Vy1 falls within the range from 1.4 V to Vb and the second voltage value Vy2 is H level;

(Second mode): if the light guide member 3A is normal, the first light sensor 55 is normal, the second light sensor 56 is normal, and the light quantity QA is less than 20%, then the first voltage value Vy1 falls within the range from 0.3 V to less than 4 V and the second voltage value Vy2 is L level;

(Third mode): if the light guide member 3A is normal, first light sensor 55 is defective (abnormal), the second light sensor 56 is normal, and the light quantity QA is 20% or more, then the first voltage value Vy1 is constant at Vb and the second voltage value Vy2 is H level;

(Fourth mode): if the light guide member 3A is normal, the first light sensor 55 is defective, the second light sensor 56 is normal, and the light quantity QA is less than 20%, then the first voltage value Vy1 is constant at Vb and the second voltage value Vy2 is L level;

(Fifth mode): if the light guide member 3A is normal, the first light sensor 55 is normal, the second light sensor 56 is defective, and the light quantity QA is 20% or more, then the first voltage value Vy1 falls within the range from 1.4 V to Vb and the second voltage value Vy2 is H level;

(Sixth mode): if the light guide member 3A is normal, the first light sensor 55 is normal, the second light sensor 56 is defective, and the light quantity QA is less than 20%, then the first voltage value Vy1 falls within the range from 0.3 V to less than 4 V and the second voltage value Vy2 is H level;

(Seventh mode): if the light guide member 3A is normal, the first light sensor 55 is defective, the second light sensor 56 is defective, and the light quantity QA is 20% or more, then the first voltage value Vy1 is constant at Vb and the second voltage value Vy2 is H level;

(Eighth mode): if the light guide member 3A is normal, the first light sensor 55 is defective, the second light sensor 56 is defective, and the light quantity QA is less than 20%, then the first voltage value Vy1 is constant at Vb and the second voltage value Vy2 is H level;

(Ninth mode): if the light guide member 3A is defective, the first light sensor 55 is normal, the second light sensor 56 is normal, and the light quantity QA is 20% or more, then the first voltage value Vy1 is 50% down and the second voltage value Vy2 is L level;

(Tenth mode): if the light guide member 3A is defective, the first light sensor 55 is normal, the second light sensor 56 is normal, and the light quantity QA is less than 20%, then the first voltage value Vy1 is 50% down and the second voltage value Vy2 is L level;

(Eleventh mode): if the light guide member 3A is defective, the first light sensor 55 is defective, the second light sensor 56 is normal, and the light quantity QA is 20% or more, then the first voltage value Vy1 is constant at Vb and the second voltage value Vy2 is L level;

(Twelfth mode): if the light guide member 3A is defective, the first light sensor 55 is defective, the second light sensor 56 is normal, and the light quantity QA is less than 20%, then the first voltage value Vy1 is constant at Vb and the second voltage value Vy2 is L level;

(Thirteenth mode): if the light guide member 3A is defective, the first light sensor 55 is normal, the second light sensor 56 is defective, and the light quantity QA is 20% or more, then the first voltage value Vy1 is 50% down and the second voltage value Vy2 is H level;

(Fourteenth mode): if the light guide member 3A is defective, the first light sensor 55 is normal, the second light sensor 56 is defective, and the light quantity QA is less than 20%, then the first voltage value Vy1 is 50% down and the second voltage value Vy2 is L level;

(Fifteenth mode): if the light guide member 3A is defective, the first light sensor 55 is defective, the second light sensor 56 is defective, and the light quantity QA is 20% or more, then the first voltage value Vy1 is constant at Vb and the second voltage value Vy2 is H level; and (Sixteenth mode): if the light guide member 3A is defective, the first light sensor 55 is defective, the second light sensor 56 is defective, and the light quantity QA is less than 20%, then the first voltage value Vy1 is constant at Vb and the second voltage value Vy2 is H level.

Figure 10:
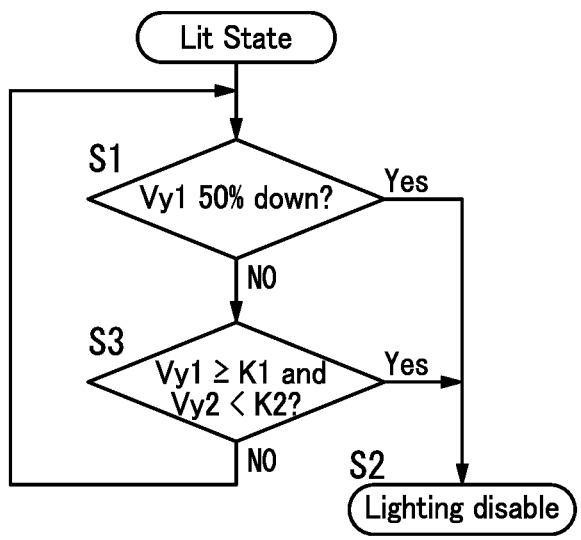
FIG. 10 is a flowchart showing the procedure of operation of the photodetector according to the second embodiment.

The defect detection processing is performed by the defect detecting unit 54 as shown in FIG. 10.

While the light source 6A is lit (i.e., in ON state), the defect detecting unit 54A determines whether or not the first voltage value Vy1 is 50% down (i.e., whether or not the first voltage value Vy1 has decreased to 50% or less of the first normal voltage value) (in Step S1). When finding the first voltage value Vy1 50% down, the defect detecting unit 54A determines the light guide member 3A to be defective, generates no lighting enable signals, and performs lighting disable processing for stopping radiating the laser beam L1A (in Step S2). On the other hand, when finding the first voltage value Vy1 not 50% down, the defect detecting unit 54 determines whether or not the first voltage value Vy1 is equal to or greater than a first threshold value K1 and whether or not the second voltage value Vy2 is less than a second threshold value K2 (in Step S3). When finding the first voltage value Vy1 equal to or greater than the first threshold value K1 and the second voltage value Vy2 less than the second threshold value K2, the defect detecting unit 54A determines that at least one of the first light sensor 55 or the light guide member 3A should be defective (i.e., detects a defect), generates no lighting enable signals, and performs lighting disable processing for stopping radiating the laser beam L1A (in Step S2). When finding the first voltage value Vy1 less than the first threshold value K1 or the second voltage value Vy2 equal to or greater than the second threshold value K2, the defect detecting unit 54A performs the processing step S1 once again.

That is to say, when finding the first voltage value Vy1 50% down, the defect detecting unit 54A determines the light guide member 3A to be defective and generates no lighting enable signals. That is to say, whenever finding the first voltage value Vy1 50% down, the defect detecting unit 54A detects a defect in the light guide member 3A irrespective of the second voltage value Vy2.

Furthermore, the defect detecting unit 54A compares the first voltage value Vy1 with the first threshold value K1 and also compares the second voltage value Vy2 with the second threshold value K2. For example, the first threshold value K1 may be Vb1−α, which is obtained by subtracting a constant a from the minimum saturated voltage value Vb1. The second threshold value K2 is a voltage value lower than H level but higher than L level. When finding the first voltage value Vy1 equal to or greater than the first threshold value K1 and the second voltage value Vy2 less than the second threshold value K2, the defect detecting unit 54A determines at least one of the first light sensor 55 or the light guide member 3A to be defective, and generates no lighting enable signals.

Thus, if the first voltage value Vy1 falls within the range from 4 V to Vb and the second voltage value Vy2 is H level as in the first and fifth modes, then the first voltage value Vy1 becomes equal to or greater than the first threshold value K1 and the second voltage value Vy2 becomes equal to or greater than the second threshold value K2. In that case, the defect detecting unit 54A generates the lighting enable signal. In the fifth mode, the second light sensor 56 is defective but the defect detecting unit 54A may have the first light sensor 55 detect a defect in the light guide member 3A, and therefore, does not need to stop radiating the laser beam L1A.

If the first voltage value Vy1 falls within the range from 0.3 V to less than 4 V and the second voltage value Vy2 is L level as in the second mode, then the first voltage value Vy1 is less than the first threshold value K1 and the second voltage value Vy2 is less than the second threshold value K2. In that case, the defect detecting unit 54A generates the lighting enable signal.

If the first voltage value Vy1 is constant at Vb and the second voltage value Vy2 is H level as in the third, seventh, eighth, fifteenth, and sixteenth modes, then the first voltage value Vy1 is equal to or greater than the first threshold value K1 and the second voltage value Vy2 is equal to or greater than the second threshold value K2. In that case, the defect detecting unit 54A generates the lighting enable signal. In the seventh and eighth modes, the second light sensor 56 is defective, but the defect detecting unit 54A is able to have the first light sensor 55 detect a defect in the light guide member 3A, and therefore, does not need to stop radiating the laser beam L1A. In the fifteenth and sixteenth modes, the light guide member 3A, the first light sensor 55, and the second light sensor 56 are all defective. However, the chances of all of these members going defective at the same time are slim. At a point in time when either the light guide member 3A or the first light sensor 55 goes defective, no lighting enable signal is generated anymore. That is to say, the chances of the lighting system 1A operating in the fifteenth or sixteenth mode are slim.

If the first voltage value Vy1 is constant at Vb and the second voltage value Vy2 is L level as in the fourth, eleventh, and twelfth modes, then the first voltage value Vy1 is equal to or greater than the first threshold value K1 and the second voltage value Vy2 is less than the second threshold value K2. In that case, the defect detecting unit 54A generates no lighting enable signals. In the fourth mode, the first light sensor 55 is defective. In the eleventh and twelfth modes, the light guide member 3A is defective.

If the first voltage value Vy1 falls within the range from 0.3 V to less than 4 V and the second voltage value Vy2 is H level as in the sixth mode, then the first voltage value Vy1 is less than the first threshold value K1 and the second voltage value Vy2 is equal to or greater than the second threshold value K2. In that case, the defect detecting unit 54A generates the lighting enable signal.

If the first voltage value Vy1 is 50% down as in the ninth, tenth, thirteenth, and fourteenth modes, then the defect detecting unit 54A determines the light guide member 3A to be defective and generates no lighting enable signals. That is to say, whenever finding the first voltage value Vy1 50% down, the defect detecting unit 54A detects a defect in the light guide member 3A irrespective of the second voltage value Vy2.

As described above, in the fourth and ninth to fourteenth modes, the defect detecting unit 54A detects a defect in the first light sensor 55 or the light guide member 3A and generates no lighting enable signals. When receiving no lighting enable signals, the output control circuit 52A deactivates the power supply circuit 51A (i.e., decreases the drive current I1A to zero) to stop radiating the laser beam L1A (i.e., prohibits the laser beam L1A from being radiated).

(2.4.2) Quantity of Light Received

In this embodiment, a second light quantity, which is the quantity of the signal light L3A received by the second light sensor 56, is smaller than a first light quantity, which is the quantity of the signal light L3A received by the first light sensor 55. This is achieved in the following manner.

As shown in FIG. 8, the condenser lens 9 converges the incoming signal light L3A toward a focus position Z1 to irradiate the photodetector 502A with the converged signal light L3A. The first light sensor 55 is arranged closer to the focus position Z1 than the second light sensor 56 is. In FIG. 8, the first light sensor 55 and the second light sensor 56 are arranged side by side perpendicularly to the direction in which the incoming signal light L3A is incident. The first light sensor 55 is located to overlap with the focus position Z1 and the second light sensor 56 is located away from the focus position Z1. Thus, the quantity of light received by the second light sensor 56 located distant from the focus position Z1 is smaller than that of light received by the first light sensor 55 located closer to the focus position Z1.

Also, as the quantity QA of the signal light L3A received increases, then the first light quantity and the second light quantity both increase. Therefore, as the first light quantity increases, the second light quantity also increases. In particular, the second light quantity is suitably proportional to the first light quantity.

As described above, the photodetector 502A detects a defect in the first light sensor 55 using the two light sensors, namely, the first light sensor 55 and the second light sensor 56. In this case, setting the quantity of the light received by the second light sensor 56 at a value smaller than the quantity of the light received by the first light sensor 55 reduces the chances of the output of the second light sensor 56 becoming saturated. Consequently, this facilitates the defect detection processing using the output of the second light sensor 56 not only when the second light sensor 56 is made to serve as a comparator but also when the second light sensor 56 is made to serve as an analog amplifier.

Furthermore, optical parameters defined with respect to the signal light L3A include a signal-to-noise ratio (SNR) of the signal light L3A. In this embodiment, the strength of the noise component included in the signal light L3A is suitably equal to or less than 20% of the strength of the signal component included in the signal light L3A. This optical parameter needs to be satisfied with respect to the first light sensor 55 and the second light sensor 56 that are spaced apart from each other as described above.

(2.5) Variation

The photoelectric transducers 551 and 561 do not have to be implemented as photodiodes but may also be any other type of photosensitive elements as well. For example, the photoelectric transducers 551 and 561 may be phototransistors, solar cells, or CdS cells.

The light-emitting element 61A may radiate a laser beam L1A in any color other than blue. The wavelength converting member 41A may have light in any color other than yellow emerge from itself based on the laser beam L1A received. Furthermore, the wavelength-converted light does not have to be white light. Furthermore, the light emitted from the light-emitting elements 61A does not have to be a laser beam.

The power supply circuit 51A does not have to have any particular circuit configuration as long as the power supply circuit 51A may output the DC drive current I1A.

Defects to be detected by the defect detecting unit 54A in the lighting system 1A include not only defects in the light guide member 3A and defects in the first light sensor 55 but also defects in the light source 6A (light-emitting elements 61A) and/or defects in the wavelength converting member 41A. The defects in the light source 6A include not only a failure that prevents the light-emitting elements 61A from radiating the laser beam L1A due to no drive current I1A flowing through the light-emitting elements 61A but also an oscillation failure that prevents the light-emitting elements 61A from radiating the laser beam L1A as expected due to some problem with the oscillation operation by the light-emitting elements 61A although the drive current I1A does flow through the light-emitting elements 61A. Also, as used herein, the state where the light-emitting elements 61A are prevented from radiating a laser beam as expected refers to not only a situation where the light-emitting elements 61A radiate no laser beams L1A at all but also a situation where the light-emitting elements 61A radiate an unexpected type of light other than the laser beam L1A. Defects in the wavelength converting member 41A include the wavelength converting member's 41A damage, chipping, peeling, and falling off.

This variation is also able to achieve the same advantages as the ones of the second embodiment described above.

Third Embodiment (3.1) Overall Configuration for Lighting System

Next, an overall configuration for a lighting system 1B according to a third embodiment of the present disclosure will be described with reference to the accompanying drawings. In the following description, any constituent element of this third embodiment, having the same function as a counterpart of the first embodiment described above, will be designated by a combination of the same reference sign as that counterpart's and "B" added as a suffix to the end of the reference sign.

As shown in FIG. 11, the lighting system 1B includes a light source device 2B, a light guide member 3B, and a light distributor 4B. The light source device 2B radiates a laser beam L1B. The laser beam L1B is incident on a first end 31B of the light guide member 3B, passes through the inside of the light guide member 3B, and then emerges through a second end 32B of the light guide member 3B. The laser beam L1B emerging through the second end 32B is converted by a wavelength converting member 41B of the light distributor 4B into a wavelength-converted light beam. Most of the wavelength-converted light beam emerges from the light distributor 4B as an illuminating light beam L2B to irradiate a lighting space. Meanwhile, part of the wavelength-converted light beam is incident as signal light L3B on the second end 32B of the light guide member 3B. The signal light L3B passes through the inside of the light guide member 3B and emerges through the first end 31B of the light guide member 3B.

The light source device 2B includes a light source driver 5B, a light source 6B, and an optical member 7B. The light source driver 5B lights (i.e., turns ON) the light source 6B by supplying a DC drive current I1B to the light source 6B. When supplied with the drive current I1B, the light source 6B radiates the laser beam L1B. The laser beam L1B emitted from the light source 6B is incident on the first end 31B of the light guide member 3B through the optical member 7B. The housing 2a shown in FIG. 2 houses the light source driver 5B, the light source 6B, and the optical member 7B. The light source device 2B is used along with the light guide member 3B and the light distributor 4B.

The light source driver 5B includes a driving unit 501B and a photodetector 502B. The driving unit 501B is provided with an AC voltage by an AC power supply P1B and supplies a drive current I1B to the light source 6B. The photodetector 502B detects the signal light L3B that has emerged from the first end 31B of the light guide member 3B. The signal light L3B has been incident on the second end 32B of the light guide member 3B, passed through the inside of the light guide member 3B, and then emerged through the first end 31B of the light guide member 3B.

An output control circuit 52B and a defect detecting unit 54B may be implemented as a controller 503B. The controller 503B may be implemented as at least one control IC or a computer system, whichever is appropriate. The computer system performs the respective functions of the output control circuit 52B and the defect detecting unit 54B of the present disclosure by making a processor execute a program.

This lighting system 1B may be used as an underwater lighting for radiating light under the water or a headlight for automobiles.

(3.2) Photodetector

The photodetector 502B includes a light sensor 53B and the defect detecting unit 54B.

As shown in FIG. 12, the light sensor 53B includes a photoelectric transducer 531B and an amplification unit 532B. The photoelectric transducer 531B may be implemented as a photosensitive element such as a photodiode and outputs an optical current (electrical signal) corresponding to the quantity of the signal light L3B received. The amplification unit 532B includes a current amplifier, a resistor, and other components, transforms an optical current amplified into a voltage, and then outputs the voltage thus transformed as a detection signal Y1B. That is to say, the detection signal Y1B is a voltage signal. The larger the quantity of the signal light L3B is, the greater the value of the optical current is and the higher the voltage value of the detection signal Y1B is. The light sensor 53B is electrically connected to the defect detecting unit 54B. The detection signal Y1B is output to the defect detecting unit 54B.

On the optical path leading to the light sensor 53B, provided is an optical filter which transmits the white light and attenuates light in the other colors. This allows the light sensor 53B to receive the white signal light L3B almost without receiving light other than the white signal light L3B.

The defect detecting unit 54B receives the detection signal Y1B to detect any defect in the light sensor 53B. The output control circuit 52B controls the power supply circuit 51B based on a result of the defect detection.

(3.3) Lighting Control

Next, it will be described how the lighting system 1B performs lighting control.

First, when AC power is supplied from the AC power supply P1B to the lighting system 1B, the output control circuit 52B controls the power supply circuit 51B to have the drive current I1B supplied to the light source 6B. When supplied with the drive current I1B, the plurality of light-emitting elements 61B of the light source 6B radiate a blue laser beam L1B. The laser beam L1B is transmitted through the optical member 7B and the light guide member 3B to impinge on the wavelength converting member 41B of the light distributor 4B. The wavelength converting member 41B produces white light (wavelength-converted light beam) based on the blue laser beam L1B. Most of the white light emerges, from the light distributor 4B, as an illuminating light beam L2B to irradiate the lighting space. Meanwhile, part of the white light is transmitted, as the signal light L3B, through the light guide member 3B and the optical member 7B to impinge on the light sensor 53B of the photodetector 502B.

The signal light L3B is the same white light as the illuminating light beam L2B that actually irradiates the lighting space, and includes information about the quantity of the illuminating light beam L2B. That is to say, the greater the quantity of the illuminating light beam L2B is, the larger the quantity of the signal light L3B is. Therefore, the larger the quantity of the illuminating light beam L2B is, the higher the voltage value of the detection signal Y1B is. In other words, the smaller the quantity of the illuminating light beam L2B is, the lower the voltage value of the detection signal Y1B is. That is to say, information about the quantity of the illuminating light beam L2B is fed back as the signal light L3B to the light source driver 5B.

The output control circuit 52B monitors the quantity of the illuminating light beam L2B emitted from the light source 6B based on the voltage value of the detection signal Y1B. Then, the output control circuit 52B performs feedback control to bring the drive current I1B into conformity with a target current by controlling the power supply circuit 51B such that the voltage value of the detection signal Y1B agrees with a target voltage value. The target voltage value may be a predetermined fixed value or a variable value corresponding to a light intensity control signal received from an external device. The output control circuit 52B is allowed to perform light intensity control by varying the target voltage value.

(3.4) Defect Detection

Next, it will be described how the lighting system 1B detects defects.

(3.4.1) Sensor Defects

Figure 13:
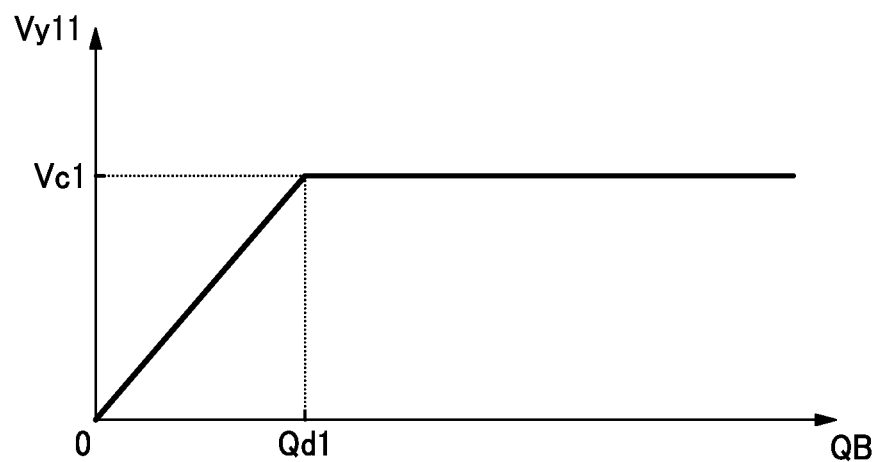
FIG. 13 is a graph showing the output characteristic of a light sensor of the photodetector according to the third embodiment.

FIG. 13 shows the output characteristic of the light sensor 53B and illustrates how the voltage value Vy11 of the detection signal Y1B changes with the quantity QB of the signal light L3B. As the light quantity QB increases from zero, the voltage value Vy11 also increases linearly from zero. When the light quantity QB exceeds a saturated light quantity Qd1 (first value), the voltage value Vy11 becomes constant at a saturated voltage value (saturated value) Vc1 (second value). That is to say, the amplification unit 532B serves as an analog amplifier. While the light quantity QB falls within the range from 0 to Qd1, the light sensor 53B operates in a linear range in which the voltage value Vy11 is proportional to the light quantity QB. That is to say, the larger the light quantity QB is, the higher the voltage value Vy11 becomes. However, once the light quantity QB has exceeded the saturated light quantity Qd1, the light sensor 53B operates in a saturated range where the output of the light sensor 53B is saturated, and the voltage value Vy11 plateaus (becomes constant) at the saturated voltage value Vc1. The saturated light quantity Qd1 may be about 25% of the maximum value of the light quantity QB (i.e., the light quantity QB when the light source 6 is lit with a rated voltage). Making the light sensor 53B operate in not only the linear range but also the saturated range in this manner allows the dynamic range of the quantity QB of the signal light L3B to be broadened. The output control circuit 52B normally controls the drive current I1B at a rated current value and supplies the rated drive current I1 to the light source 6B. The light quantity QB with the rated drive current I1B is larger than the saturated light quantity Qd1. The normal voltage value Vy11 becomes equal to the saturated voltage value Vc1. Note that when the saturated voltage value Vc1 increases slightly (to a degree much smaller than the increase in the linear range) as the light quantity QB increases, the minimum value of the saturated voltage value Vc1 is regarded as the second value according to the present disclosure.

Nevertheless, due to the electrostatic breakdown, a failure mode, or any other abnormal condition of the light sensor 53B, for example, the voltage value Vy11 of the detection signal Y1B may sometimes be fixed at the saturated voltage value Vc1 irrespective of the magnitude of the light quantity QB. When the voltage value Vy11 is fixed at the saturated voltage value Vc1, the defect detecting unit 54B is unable to perform the feedback control described above and the defect detection to be described later. Thus, the defect detecting unit 54B performs sensor defect detection processing for detecting the electrostatic breakdown, failure mode, and other abnormal conditions of the light sensor 53B as defects of the light sensor 53B.

Figure 14:
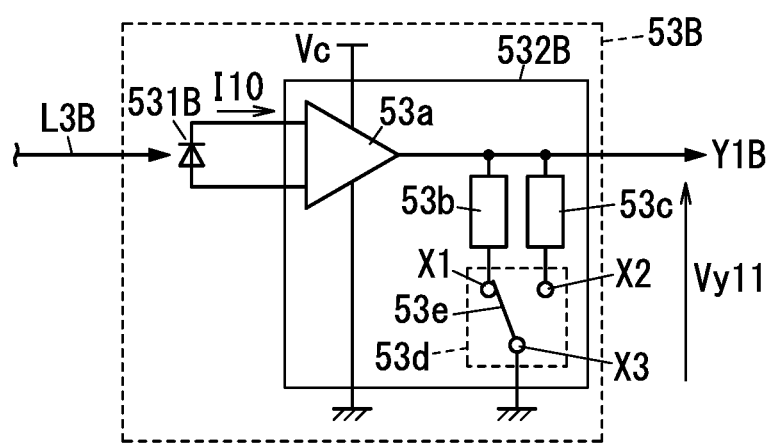
FIG. 14 is a circuit diagram illustrating a configuration for the light sensor of the photodetector according to the third embodiment.

FIG. 14 illustrates a specific configuration for an amplification unit 532B of the light sensor 53B. The amplification unit 532B includes a current amplifier 53a, a resistor 53b, a resistor 53c, and an amplification factor changing unit 53d.

The current amplifier 53a amplifies, using a control voltage Vc as a drive voltage, an optical current (electrical signal) I10 of the photoelectric transducer 531B and outputs an amplified current (output current). One terminal of the resistor 53b and one terminal of the resistor 53c are electrically connected to the output terminal of the current amplifier 53a. The other terminal of the resistor 53b and the other terminal of the resistor 53c are electrically connected to the amplification factor changing unit 53d.

The amplification factor changing unit 53d includes a switch 53e. The switch 53e includes two fixed contacts X1 and X2 and a moving contact X3 and is configured to selectively connect the moving contact X3 to either the fixed contact X1 or the fixed contact X2. The fixed contact X1 is electrically connected to the other terminal of the resistor 53b, and the fixed contact X2 is electrically connected to the other terminal of the resistor 53c. The moving contact X3 is electrically connected to a circuit ground. Thus, selectively connecting the moving contact X3 to either the fixed contact X1 or the fixed contact X2 allows the switch 53e to electrically connect either the other terminal of the resistor 53b or the other terminal of the resistor 53c to the circuit ground. That is to say, the amplification factor changing unit 53d switchably selects either the resistor 53b or the resistor 53c as a resistor (gain resistor) to be connected between the output terminal of the current amplifier 53a and the circuit ground. Therefore, the output current of the current amplifier 53a flows through either the resistor 53b or the resistor 53c and the switch 53e. Supposing that the voltage drop to be caused by the output current at the switch 53e is approximately equal to zero, a voltage value Vy11 is produced due to a voltage drop caused by the gain resistor (which is either the resistor 53b or the resistor 53c) between the output terminal of the current amplifier 53a and the circuit ground, and the detection signal Y1B is output through the output terminal of the current amplifier 53a.

In this embodiment, the resistance value of the resistor 53b is greater than that of the resistor 53c. The voltage value Vy11 when the resistor 53b is supposed to constitute the gain resistor with respect to a constant optical current I10 is greater than the voltage value Vy11 when the resistor 53c is supposed to constitute the gain resistor with respect to the constant optical current I10. That is to say, the amplification factor changing unit 53d is able to change the amplification factor of the amplification unit 532B by selectively connecting the moving contact X3 to either the fixed contact X1 or the fixed contact X2. Specifically, the amplification factor when the resistor 53b is supposed to constitute the gain resistor is larger than the amplification factor when the resistor 53c is supposed to constitute the gain resistor. Note that the output characteristic of the light sensor 53B shown in FIG. 13 is obtained by using the resistor 53b as the gain resistor when the light sensor 53B is in normal condition. That is to say, supposing the light sensor 53B is in normal condition and the resistor 53b is the gain resistor (i.e., the amplification factor is maximum), when the light quantity QB of the signal light L3B exceeds the saturated light quantity Qd1, the voltage value Vy11 of the detection signal Y1B becomes the saturated voltage value Vc1.

Switching control of the amplification factor changing unit 53d is performed by the defect detecting unit 54B. Normally, the defect detecting unit 54B controls the amplification factor changing unit 53d to make the amplification factor changing unit 53d select the resistor 53b as the gain resistor (i.e., the amplification factor is maximum). Then, the defect detecting unit 54B controls the amplification factor changing unit 53d to make the amplification factor changing unit 53d periodically change the gain resistors from the resistor 53b to the resistor 53c. That is to say, the amplification factor changing unit 53d periodically changes the amplification factor of the amplification unit 532B. Every time the gain resistors are changed from the resistor 53b to the resistor 53c, the defect detecting unit 54B compares the voltage value Vy11 when the gain resistor is the resistor 53b with the voltage value Vy11 when the gain resistor is the resistor 53c. Then, when finding the magnitude of decrease ΔVy11 (see FIG. 15) obtained by subtracting the voltage value Vy11 when the gain resistor is the resistor 53c from the voltage value Vy11 when the gain resistor is the resistor 53b to be equal to or greater than a predetermined decision threshold value K11 (see FIG. 15), the defect detecting unit 54B determines the light sensor 53B to be normal. On the other hand, when finding the magnitude of decrease ΔVy11 to be less than the decision threshold value K11, the defect detecting unit 54B determines the light sensor 53B to be defective. This allows the defect detecting unit 54B to detect a defect in the light sensor 53B in which the voltage value Vy11 is fixed at the saturated voltage value Vc1.

Figure 15:
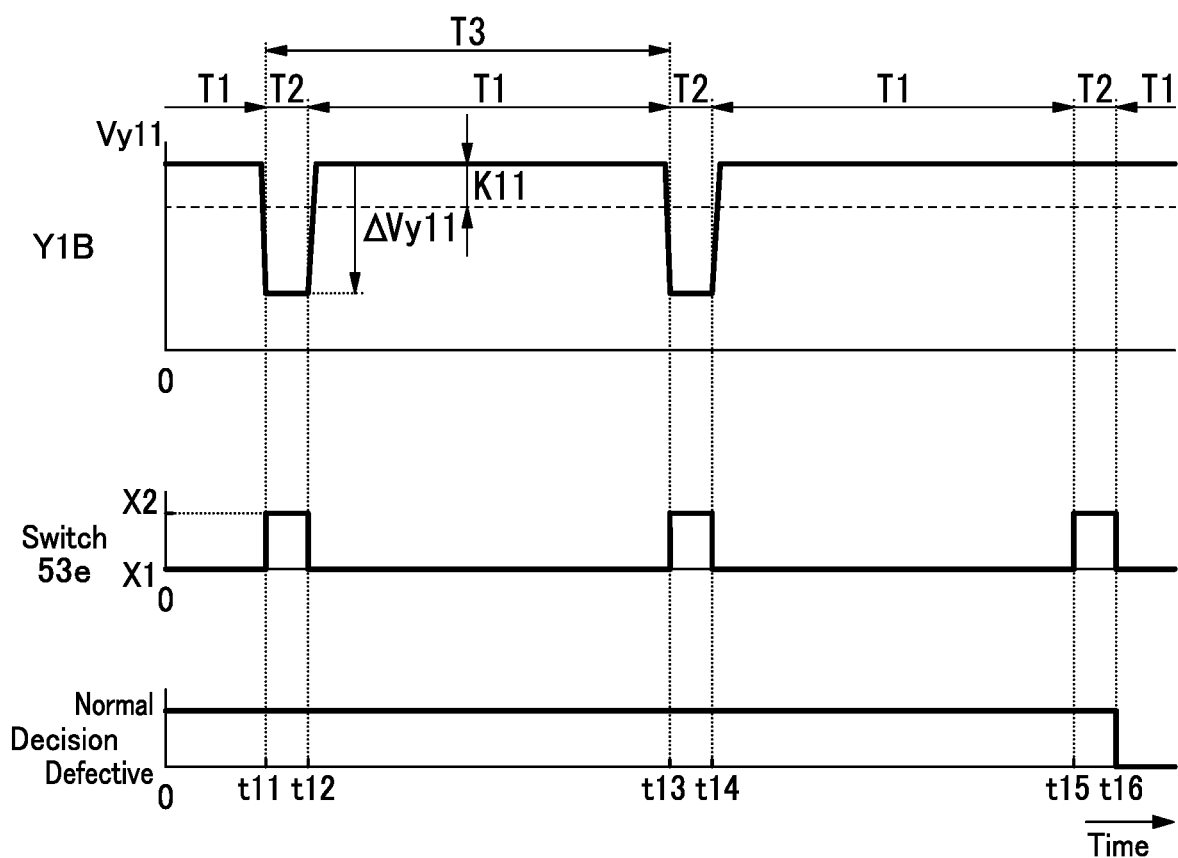
FIG. 15 is a timing diagram illustrating how the photodetector according to the third embodiment may operate.

The top portion of FIG. 15 shows the waveform of the detection signal Y1B, the middle portion of FIG. 15 shows the states of the switch 53e, and the bottom portion of FIG. 15 shows the result of defect detection by the defect detecting unit 54B. The amplification factor changing unit 53d operates such that a normal period T1 in which the resistor 53b serves as the gain resistor alternates with a detection period T2 in which the resistor 53c serves as the gain resistor. That is to say, the detection period T2 is set at regular intervals, each of which is as long as a period T3 (=T1+T2). In this case, the normal period T1 is suitably set as a period longer than the detection period T2. Setting the normal period T1 as a period longer than the detection period T2 allows the feedback control described above and detection of other defects in the lighting system 1B to be performed during the normal period T1.

As shown in FIG. 15, the first detection period T2 (from a time t11 through a time t12) and the second detection period T2 (from a time t13 through a time t14) have the magnitude of decrease ΔVy11 that is equal to or greater than the decision threshold value K11, and therefore, the defect detecting unit 54B determines the light sensor 53B to be normal. After the second detection period T2, however, either electrostatic breakdown or failure mode is caused in the light sensor 53B, thus making the optical current of the photoelectric transducer 531B or the output current of the current amplifier 53a either an over current or a short-circuit current. Thus, in the third detection period T2 (from a time t15 through a time t16), even if the amplification factor of the amplification unit 532B is decreased, the voltage value Vy11 becomes equal to the saturated voltage value Vc1 and the magnitude of decrease ΔVy11 becomes smaller than the decision threshold value K11. Therefore, the defect detecting unit 54B determines the light sensor 53B to be defective in the third detection period T2.

As can be seen, when finding the magnitude of decrease ΔVy11 in the voltage value Vy11 less than the decision threshold value K11 as the amplification factor decreases, the defect detecting unit 54B determines the light sensor 53B to be defective. This allows the photodetector 502B to accurately detect a defect in the light sensor 53B.

Then, the defect detecting unit 54B notifies the output control circuit 52B of the defect detected in the light sensor 53B.

When notified of the defect detected in the light sensor 53B, the output control circuit 52B controls the power supply circuit 51B so as to reduce the drive current I1B. For example, the output control circuit 52B may reduce the drive current I1B to zero to make the light source 6B stop emitting the laser beam L1B. Alternatively, the output control circuit 52B may reduce the quantity of the laser beam L1B emitted from the light source 6B by decreasing the drive current I1B. Still alternatively, when notified of the defect detected in the light sensor 53B, the output control circuit 52B may output the drive current I1B intermittently to blink the laser beam L1B. When the laser beam L1B comes to have a reduced light quantity, blinks, or has its output stopped, the illuminating light L2B turns down (dims), blinks, or turns OFF, thus notifying a person around the lighting system 1B of the abnormal condition.

(3.5) First Variation

Optionally, the defect detecting unit 54B may detect other defects in the lighting system 1B based on the detection signal Y1B. Examples of other defects in the lighting system 1B include defects in the light guide member 3B, defects in the wavelength converting member 41B, and defects in the light source 6B (light-emitting elements 61B).

As used herein, defects in the light guide member 3B refer to, for example, the light guide member's 3B snapping or coming loose from the light source device 2B or the light distributor 4B. When the light guide member 3B comes to have any of such defects, the signal light L3B may leak out of the snapped portion of the light guide member 3B or may even fail to be transmitted to the light source device 2B. Therefore, when the light guide member 3B has such defects, the quantity of the signal light L3B impinging on the light sensor 53B decreases significantly compared to the normal condition. Consequently, when the light guide member 3B is in abnormal condition, the voltage value of the detection signal Y1B is significantly lower than that of the detection signal Y1B when the light guide member 3B is in normal condition.

Defects in the wavelength converting member 41B include the wavelength converting member's 41B damage, chipping, peeling, and falling off. When the wavelength converting member 41B comes to have any of such defects, the quantity of the signal light L3B incident on the second end 32B of the light guide member 3B decreases significantly compared to the normal condition. Consequently, when the wavelength converting member 41B is in abnormal condition, the voltage value of the detection signal Y1B is significantly lower than that of the detection signal Y1B when the wavelength converting member 41B is in normal condition.

Defects in the light source 6B include not only a failure that prevents the light-emitting elements 61B from emitting the laser beam L1B due to no drive current I1B flowing through the light-emitting elements 61B but also an oscillation failure that prevents the light-emitting elements 61B from emitting the laser beam L1B due to some problem with the oscillation operation by the light-emitting elements 61B although the drive current I1B does flow through the light-emitting elements 61B. Also, as used herein, the state where the light-emitting elements 61B are prevented from emitting a laser beam refers to not only a situation where the light-emitting elements 61B emit no laser beams L1B at all but also a situation where the light-emitting elements 61B emit an unexpected type of light other than the laser beam L1B. Such a defect in the light source 6B is caused by a defect in at least one of the plurality of light-emitting elements 61B. When the light source 6B has such a defect, the quantity of the signal light L3B emerging through the first end 31B of the light guide member 3B is significantly lower than in normal condition. Nevertheless, when the light source 6B has a defect, chances of all of those light-emitting elements 61B going out of order are slim and only some of those light-emitting elements 61B are likely to have such a defect. For example, if the light source 6B consists of four light-emitting elements 61B, the chances of only one or two of the four light-emitting elements 61B going defective are relatively high.

Therefore, when the light guide member 3B, the wavelength converting member 41B, or the light source 6B has defects, the voltage value of the detection signal Y1B becomes lower than that of the detection signal Y1B in normal condition. However, as described above, monitoring the voltage value of the detection signal Y1B in an initial stage on and after the light source 6B has just been turned ON (including a point in time when the light source 6 is turned ON) and in a steady state in which the light source 6B is kept ON allows other defects, including defects in the light guide member 3B, defects in the wavelength converting member 41B, and defects in the light source 6B (light-emitting elements 61B), to be detected. When informed of other defects by the defect detecting unit 54B, the output control circuit 52B controls the power supply circuit 51B in such a manner as to reduce the drive current I1B.

(3.6) Second Variation

When finding the variation (such as an increase) in the voltage value Vy11 of the detection signal Y1B smaller than a decision threshold value as the amplification factor increases, the defect detecting unit 54B may determine that the light sensor 53B should be defective.

The light sensor 53B does not have to be implemented as a photodiode but may also be any other type of photosensitive element as well. For example, the light sensor 53B may be a phototransistor, a solar cell, or a CdS cell.

The light-emitting element 61B may radiate a laser beam L1B in any color other than blue. The wavelength converting member 41B may have light in any color other than yellow emerge from itself based on the laser beam L1B received. Furthermore, the wavelength-converted light does not have to be white light. Furthermore, the light emitted from the light-emitting elements 61B does not have to be a laser beam.

The power supply circuit 51B does not have to have any particular circuit configuration as long as the power supply circuit 51B may output a DC drive current I1B.

Each of these variations is also able to achieve the same advantages as the ones of the third embodiment described above.

Note that embodiments and their variations described above are only examples of the present disclosure and should not be construed as limiting. Rather, those embodiments and variations may be readily modified in various manners depending on a design choice or any other factor without departing from a true spirit and scope of the present disclosure.

Optionally, some configurations of the embodiments and their variations described above may be adopted in combination as appropriate.

Aspects

The exemplary embodiments and variations disclosed herein are implementations of the following aspects of the present disclosure.

A light source device (2, 2A, 2B) according to a first aspect is used with: a light guide member (3, 3A, 3B) to guide light from a first end (31, 31A, 31B) to a second end (32, 32A, 32B), and vice versa; and a wavelength converting member (41, 41A, 41B). The wavelength converting member (41, 41A, 41B) converts a first light beam (L1, L1A, L1B) that has been incident on the first end (31, 31A, 31B) and has emerged through the second end (32, 32A, 32B) into a second light beam (wavelength-converted light beam) having a different wavelength from the first light beam (L1, L1A, L1B). The light source device (2, 2A, 2B) includes: at least one light-emitting element (61, 61A, 61B); a light sensor (53, 53B, 55, 56); and a driving unit (501, 501A, 501B). The at least one light-emitting element (61, 61A, 61B) radiates the first light beam (L1, L1A, L1B) to be incident on the first end (31, 31A, 31B) by being supplied with a drive current (I1, I1A, I1B). The light sensor (53, 53B, 55, 56) detects signal light (L3, L3A, L3B), which is a component of the second light beam and which has been incident on the second end (32, 32A, 32B) and transmitted to the first end (31, 31A, 31B). The driving unit (501, 501A, 501B) supplies the drive current (I1, I1A, I1B) to the at least one light-emitting element (61, 61A, 61B) and controls the drive current (I1, I1A, I1B) based on a result of detection of the signal light (L3, L3A, L3B).

This light source device (2, 2A, 2B) includes the light sensor (53, 53B, 55, 56) and yet may have a simplified configuration.

In a light source device (2, 2A, 2B) according to a second aspect, which may be implemented in conjunction with the first aspect, the driving unit (501, 501A, 501B) suitably controls the drive current (I1, I1A, I1B) such that the signal light (L3, L3A, L3B) has a predetermined light quantity.

This light source device (2, 2A, 2B) is able to perform feedback control on the drive current (I1, I1A, I1B).

In a light source device (2, 2A, 2B) according to a third aspect, which may be implemented in conjunction with the first or second aspect, the at least one light-emitting element (61, 61A, 61B) suitably includes a plurality of light-emitting elements (61, 61A, 61B).

This light source device (2, 2A, 2B) includes the plurality of light-emitting elements (61, 61A, 61B) and the light sensor (53, 53B, 55, 56) and yet may have a simplified configuration.

A light source device (2, 2A, 2B) according to a fourth aspect, which may be implemented in conjunction with the third aspect, suitably further includes a defect detecting unit (54, 54A, 54B) to detect any defect in the wavelength converting member (41, 41A, 41B), the light guide member (3, 3A, 3B), and the plurality of light-emitting elements (61, 61A, 61B) based on a ratio of decrease in the quantity of the signal light (L3, L3A, L3B).

This light source device (2, 2A, 2B) is able to defects in two more members using a simple configuration.

In a light source device (2, 2A, 2B) according to a fifth aspect, which may be implemented in conjunction with the fourth aspect, the defect detecting unit (54, 54A, 54B) suitably detects, when the ratio of decrease is greater than a threshold value (second threshold value), any defect in at least one of the wavelength converting member (41, 41A, 41B) or the light guide member (3, 3A, 3B), and also suitably detects, when the ratio of decrease is equal to or less than the threshold value, any defect in some of the plurality of light-emitting elements (61, 61A, 61B).

This light source device (2, 2A, 2B) is able to distinguish any defect in at least one of the wavelength converting member (41, 41A, 41B) or the light guide member (3, 3A, 3B) from a defect in some of the plurality of light-emitting elements (61, 61A, 61B).

A light source device (2, 2A, 2B) according to a sixth aspect, which may be implemented in conjunction with the fifth aspect, suitably further includes a defective element spotting unit (8) that finds, when the defect detecting unit (54, 54A, 54B) detects any defect in some of the plurality of light-emitting elements (61, 61A, 61B), a defective light-emitting element (61, 61A, 61B) among the plurality of light-emitting elements (61, 61A, 61B). The defective element spotting unit (8) turns OFF the defective light-emitting element (61, 61A, 61B).

This light source device (2, 2A, 2B) is able to notify a person around the device of the defective light-emitting element (61, 61A, 61B) among the plurality of light-emitting elements (61, 61A, 61B), and is also able to reduce the heat generated by the defective light-emitting element (61, 61A, 61B).

In a light source device (2, 2A, 2B) according to a seventh aspect, which may be implemented in conjunction with the sixth aspect, the defective element spotting unit (8) includes a plurality of switches (82) and a processing unit (81). The plurality of switches (82) are provided one to one for the plurality of light-emitting elements (61, 61A, 61B) and connected to associated light-emitting elements (61, 61A, 61B) in parallel with each other. The processing unit (81) determines, when the signal light (L3, L3A, L3B) does not change at a particular one of the plurality of switches (82) that have been sequentially turned ON one by one, that one of the plurality of light-emitting elements (61, 61A, 61B), which is associated with the particular one of the switches (82) that have been turned ON, be the defective light-emitting element.

This light source device (2, 2A, 2B) is able to detect a defective light-emitting element (61, 61A, 61B) among the plurality of light-emitting elements (61, 61A, 61B).

In a light source device (2, 2A, 2B) according to an eighth aspect, which may be implemented in conjunction with the fifth aspect, the driving unit (501, 501A, 501B) suitably controls, when the defect detecting unit (54, 54A, 54B) detects a defect in at least one of the wavelength converting member (41, 41A, 41B) or the light guide member (3, 3A, 3B), the drive current (I1, I1A, I1B) so as to turn OFF all of the plurality of light-emitting elements (61, 61A, 61B).

This light source device (2, 2A, 2B) is able to notify a person around the device of the defect, and is also able to reduce the heat generated by the defective light-emitting element (61, 61A, 61B).

In a light source device (2A) according to a ninth aspect, which may be implemented in conjunction with any one of the first to eighth aspects, the light sensor includes a first light sensor (55) and a second light sensor (56), both of which detect the signal light (L3A). A second light quantity representing a quantity of the signal light (L3A) received by the second light sensor (56) is smaller than a first light quantity representing a quantity of the signal light (L3A) received by the first light sensor (55).

This light source device (2A) is able to detect any defect in the first light sensor (55).

A light source device (2A) according to a tenth aspect, which may be implemented in conjunction with any one of the first to eighth aspects, suitably includes: a first light sensor (55) to detect the signal light (L3A) and output a first electrical signal (Y11); and a second light sensor (56) to detect the signal light (L3, L3A, L3B) and output a second electrical signal (Y12). The first electrical signal (Y11) is an analog signal with a level varying continuously as the quantity of the signal light (L3A) changes, and the second electrical signal (Y12) is a binary digital signal that goes zero or one according to the quantity of the signal light (L3A).

This light source device (2A) is able to detect any defect in the first light sensor (55).

A light source device (2A) according to an eleventh aspect, which may be implemented in conjunction with the tenth aspect, suitably further includes a defect detecting unit (54A). The defect detecting unit (54A) detects a defect when the magnitude (Vy11) of the first electrical signal (Y11) is equal to or greater than a first threshold value (K1) and the magnitude (Vy2) of the second electrical signal (Y12) is less than a second threshold value (K2).

This light source device (2A) is able to detect any defect in the first light sensor (55) using the first light sensor (55) and the second light sensor (56).

In a light source device (2A) according to a twelfth aspect, which may be implemented in conjunction with the tenth or eleventh aspect, a second light quantity representing a quantity of the signal light (L3A) received by the second light sensor (56) is smaller than a first light quantity representing a quantity of the signal light (L3A) received by the first light sensor (55).

This light source device (2A) is able to detect any defect in the first light sensor (55).

In a light source device (2A) according to a thirteenth aspect, which may be implemented in conjunction with the twelfth aspect, as the first light quantity increases, the second light quantity suitably also increases.

This light source device (2A) is able to detect any defect in the first light sensor (55) accurately.

In a light source device (2A) according to a fourteenth aspect, which may be implemented in conjunction with the thirteenth aspect, the second light quantity is suitably proportional to the first light quantity.

This light source device (2A) is able to detect any defect in the first light sensor (55) accurately.

In a light source device (2A) according to a fifteenth aspect, which may be implemented in conjunction with any one of the ninth to fourteenth aspects, the first light sensor (55) and the second light sensor (56) are arranged side by side.

This light source device (2A) is able to detect any defect in the first light sensor (55) accurately.

A light source device (2A) according to a sixteenth aspect, which may be implemented in conjunction with any one of the ninth to fifteenth aspects, suitably further includes a condensing member (9) to converge the signal light (L3A) toward a focus position (Z1). The first light sensor (55) is suitably located closer to the focus position (Z1) than the second light sensor (56) is.

This light source device (2A) is able to make the quantity of light received by the second light sensor (56) less than that of light received by the first light sensor (55).

In a light source device (2A) according to a seventeenth aspect, which may be implemented in conjunction with any one of the ninth to sixteenth aspects, the signal light (L3A) suitably includes a laser beam (L1A).

This light source device (2A) is able to detect any defect in the first light sensor (55) in a device for generating the laser beam (L1A).

In a light source device (2A) according to an eighteenth aspect, which may be implemented in conjunction with the seventeenth aspect, the signal light (L3A) is suitably a wavelength-converted light beam produced by having the laser beam (L1A) subjected to wavelength conversion processing by the wavelength converting member (41A).

This light source device (2A) is able to detect any defect in the first light sensor (55) in a device for producing the wavelength-converted light.

A light source device (2B) according to a nineteenth aspect, which may be implemented in conjunction with any one of the first to eighth aspects, suitably further includes: a light sensor (53B); an amplification factor changing unit (53d); and a defect detecting unit (54B). The light sensor (53B) includes: a photoelectric transducer (531B) to transform the signal light (L3B) into an electrical signal (I10); and an amplification unit (532B) to amplify the electrical signal and output the amplified electrical signal as a detection signal (Y1B). The amplification factor changing unit (53d) changes an amplification factor of the amplification unit (532B). The defect detecting unit (54B) performs sensor defect detection processing for detecting any defect in the light sensor (53B) based on the detection signal (Y1B). The defect detecting unit (54B) determines, when a variation ($\Delta$Vy11) in the magnitude (Vy11) of the detection signal (Y1B) is smaller than a decision threshold value (K11) as the amplification factor varies, the light sensor (53B) to be defective.

This light source device (2B) is able to detect any defect in the light sensor (53B) accurately.

In a light source device (2B) according to a twentieth aspect, which may be implemented in conjunction with the nineteenth aspect, in a situation where the light sensor (53B) is normal and the amplification factor is maximum, when the quantity (QB) of the signal light (L3B) exceeds a first value (Qd1), the magnitude (Vy11) of the detection signal (Y1B) suitably becomes equal to or greater than a second value (Vc1).

This light source device (2B) is able to broaden the dynamic range of the quantity (QB) of the signal light (L3B).

In a light source device (2B) according to a twenty-first aspect, which may be implemented in conjunction with the twentieth aspect, the second value (Vc1) is suitably a saturated value of the magnitude (Vy11) of the detection signal (Y1B).

This light source device (2B) is able to broaden the dynamic range of the quantity (QB) of the signal light (L3B).

In a light source device (2B) according to a twenty-second aspect, which may be implemented in conjunction with any one of the nineteenth to twenty-first aspects, the amplification factor changing unit (53d) suitably changes the amplification factor periodically.

This light source device (2B) is able to detect any defect in the light sensor (53B) periodically.

In a light source device (2B) according to a twenty-third aspect, which may be implemented in conjunction with any one of the nineteenth to twenty-second aspects, the amplification factor changing unit (53d) suitably makes a period (T1) in which the amplification factor is set at a maximum value longer than a period (T2) in which the amplification factor is set at a value other than the maximum value.

This light source device (2B) is able to perform feedback control and detection of other defects in the period (T1) in which the amplification factor is set at the maximum value.

In a light source device (2B) according to a twenty-fourth aspect, which may be implemented in conjunction with any one of the nineteenth to twenty-third aspects, the variation is suitably the magnitude ($\Delta Vy11$) of decrease in the level (Vy11) of the detection signal (Y1B). The defect detecting unit (54B) determines, when the magnitude ($\Delta Vy11$) of decrease is smaller than a decision threshold value (K11) as the amplification factor decreases, the light sensor (53B) to be defective.

This light source device (2B) is still able to detect any defect in the light sensor (3B) accurately even when the dynamic range of the quantity (QB) of the signal light (L3B) is broadened.

A light source driver (5, 5A, 5B) according to a twenty-fifth aspect is for use with a light guide member (3, 3A, 3B), a wavelength converting member (41, 41A, 41B), and at least one light-emitting element (61, 61A, 61B). The light guide member (3, 3A, 3B) guides light from a first end (31, 31A, 31B) to a second end (32, 32A, 32B), and vice versa. The wavelength converting member (41, 41A, 41B) converts a first light beam (L1, L1A, L1B) that has been incident on the first end (31, 31A, 31B) and has emerged through the second end (32, 32A, 32B) into a second light beam (wavelength-converted light beam) having a different wavelength from the first light beam (L1, L1A, L1B). The at least one light-emitting element (61, 61A, 61B) radiates the first light beam (L1, L1A, L1B) by being supplied with a drive current (I1, I1A, I1B). The light source driver (5, 5A, 5B) includes a light sensor (53, 53B, 55, 56) and a driving unit (501, 501A, 501B). The light sensor (53, 53B, 55, 56) detects signal light (L3, L3A, L3B), which is a component of the second light beam and which has been incident on the second end (32, 32A, 32B) and transmitted to the first end (31, 31A, 31B). The driving unit (501, 501A, 501B) supplies the drive current (I1, I1A, I1B) to the at least one light-emitting element (61, 61A, 61B) and controls the drive current (I1, I1A, I1B) based on a result of detection of the signal light (L3, L3A, L3B).

This light source driver (5, 5A, 5B) includes the light sensor (53, 53B, 55, 56) and yet may have a simplified configuration.

In a light source driver (5A) according to a twenty-sixth aspect, which may be implemented in conjunction with the twenty-fifth aspect, the light sensor suitably includes a first light sensor (55) and a second light sensor (56), both of which detect the signal light (L3A). A second light quantity representing a quantity of the signal light (L3A) received by the second light sensor (56) is smaller than a first light quantity representing a quantity of the signal light (L3A) received by the first light sensor (55).

This light source driver (5A) is able to detect any defect in the first light sensor (55).

A light source driver (5A) according to a twenty-seventh aspect, which may be implemented in conjunction with the twenty-fifth aspect, suitably further includes: a first light sensor (55) to detect the signal light (L3A) and output a first electrical signal (Y11); and a second light sensor (56) to detect the signal light (L3A) and output a second electrical signal (Y12). The first electrical signal (Y11) is an analog signal with a level varying continuously as the quantity of the signal light (L3A) changes, and the second electrical signal (Y12) is a binary digital signal that goes zero or one according to the quantity of the signal light (L3A).

This light source driver (5A) is able to detect any defect in the first light sensor (55).

A light source driver (5B) according to a twenty-eighth aspect, which may be implemented in conjunction with the twenty-fifth aspect, suitably includes a light sensor (53B), an amplification factor changing unit (53d), and a defect detecting unit (54B). The light sensor (53B) includes: a photoelectric transducer (531B) to transform the signal light (L3B) into an electrical signal (I10); and an amplification unit (532B) to amplify the electrical signal and output the amplified electrical signal as a detection signal (Y1B). The amplification factor changing unit (53d) changes an amplification factor of the amplification unit (532B). The defect detecting unit (54B) performs sensor defect detection processing for detecting any defect in the light sensor (53B) based on the detection signal (Y1B). The defect detecting unit (54B) determines, when a variation ($\Delta Vy11$) in the magnitude (Vy11) of the detection signal (Y1B) is smaller than a decision threshold value (K11) as the amplification factor varies, the light sensor (53B) to be defective.

This light source driver (5B) is able to detect any defect in the light sensor (53B) accurately.

A lighting system (1, 1A, 1B) according to a twenty-ninth aspect includes a light guide member (3, 3A, 3B), a wavelength converting member (41, 41A, 41B), at least one light-emitting element (61, 61A, 61B), a light sensor (53, 53B, 55, 56), and a driving unit (501, 501A, 501B). The light guide member (3, 3A, 3B) guides light from a first end (31, 31A, 31B) to a second end (32, 32A, 32B), and vice versa. The wavelength converting member (41, 41A, 41B) converts a first light beam (L1, L1A, L1B) that has been incident on the first end (31, 31A, 31B) and has emerged through the second end (32, 32A, 32B) into a second light beam (wavelength-converted light beam) having a different wavelength from the first light beam (L1, L1A, L1B). The at least one light-emitting element (61, 61A, 61B) radiates the first light beam (L1, L1A, L1B) by being supplied with a drive current (I1, I1A, I1B). The light sensor (53, 53B, 55, 56) detects signal light (L3, L3A, L3B), which is a component of the second light beam and which has been incident on the second end (32, 32A, 32B) and transmitted to the first end (31, 31A, 31B). The driving unit (501, 501A, 501B) supplies the drive current (I1, I1A, I1B) to the at least one light-emitting element (61, 61A, 61B) and controls the drive current (I1, I1A, I1B) based on a result of detection of the signal light (L3, L3A, L3B).

This lighting system (1, 1A, 1B) includes the light sensor (53, 53B, 55, 56) and yet may have a simplified configuration.

In a lighting system (1A) according to a thirtieth aspect, which may be implemented in conjunction with the twenty-ninth aspect, the light sensor includes a first light sensor (55) and a second light sensor (56), both of which detect the signal light (L3A). A second light quantity representing a quantity of the signal light (L3A) received by the second light sensor (56) is smaller than a first light quantity representing a quantity of the signal light (L3A) received by the first light sensor (55).

This lighting system (1A) is able to detect any defect in the first light sensor (55).

A lighting system (1A) according to a thirty-first aspect, which may be implemented in conjunction with the twenty-ninth aspect, suitably includes: a first light sensor (55) to detect the signal light (L3A) and output a first electrical signal (Y11); and a second light sensor (56) to detect the signal light (L3A) and output a second electrical signal (Y12). The first electrical signal (Y11) is an analog signal with a level varying continuously as the quantity of the signal light (L3A) changes, and the second electrical signal (Y12) is a binary digital signal that goes zero or one according to the quantity of the signal light (L3A).

This lighting system (1A) is able to detect any defect in the first light sensor (55).

A lighting system (1B) according to a thirty-second aspect, which may be implemented in conjunction with the twenty-ninth aspect, suitably includes a light sensor (53B), an amplification factor changing unit (53d), and a defect detecting unit (54B). The light sensor (53B) includes: a photoelectric transducer (531B) to transform the signal light (L3B) into an electrical signal (I10); and an amplification unit (532B) to amplify the electrical signal and output the amplified electrical signal as a detection signal (Y1B). The amplification factor changing unit (53d) changes an amplification factor of the amplification unit (532B). The defect detecting unit (54B) performs sensor defect detection processing for detecting any defect in the light sensor (53B) based on the detection signal (Y1B). The defect detecting unit (54B) determines, when a variation (ΔVy11) in the magnitude (Vy11) of the detection signal (Y1B) is smaller than a decision threshold value (K11) as the amplification factor varies, the light sensor (53B) to be defective.

This lighting system (1B) is able to detect any defect in the light sensor (53B) accurately.

A photodetector (502A) according to a thirty-third aspect includes a first light sensor (55) and a second light sensor (56), both of which detect the signal light (L3A). A second light quantity representing a quantity of the signal light (L3A) received by the second light sensor (56) is smaller than a first light quantity representing a quantity of the signal light (L3A) received by the first light sensor (55).

This photodetector (502A) is able to detect any defect in the first light sensor (55).

A photodetector (502A) according to a thirty-fourth aspect suitably includes a first light sensor (55) to detect the signal light (L3A) and output a first electrical signal (Y11); and a second light sensor (56) to detect the signal light (L3A) and output a second electrical signal (Y12). The first electrical signal (Y11) is an analog signal with a level varying continuously as the quantity of the signal light (L3A) changes. The second electrical signal (Y12) is a binary digital signal that goes zero or one according to the quantity of the signal light (L3A).

This photodetector (502A) is able to detect any defect in the first light sensor (55).

A photodetector (502A) according to a thirty-fifth aspect, which may be implemented in conjunction with the thirty-fourth aspect, suitably further includes a defect detecting unit (54A). The defect detecting unit (54A) detects a defect when the magnitude (Vy1) of the first electrical signal (Y11) is equal to or greater than a first threshold value (K1) and the magnitude (Vy2) of the second electrical signal (Y12) is less than a second threshold value (K2).

This photodetector (502A) is able to detect any defect in the first light sensor (55) by using a configuration including the first light sensor (55) and the second light sensor (56).

In a photodetector (502A) according to a thirty-sixth aspect, which may be implemented in conjunction with the thirty-fourth or thirty-fifth aspect, a second light quantity representing a quantity of the signal light (L3A) received by the second light sensor (56) is smaller than a first light quantity representing a quantity of the signal light (L3A) received by the first light sensor (55).

This photodetector (502A) is able to detect any defect in the first light sensor (55).

In a photodetector (502A) according to a thirty-seventh aspect, which may be implemented in conjunction with the thirty-sixth aspect, as the first light quantity increases, the second light quantity suitably also increases.

This photodetector (502A) is able to detect any defect in the first light sensor (55) accurately.

In a photodetector (502A) according to a thirty-eighth aspect, which may be implemented in conjunction with the thirty-seventh aspect, the second light quantity is suitably proportional to the first light quantity.

This photodetector (502A) is able to detect any defect in the first light sensor (55) accurately.

In a photodetector (502A) according to a thirty-ninth aspect, which may be implemented in conjunction with any one of the thirty-third to thirty-eighth aspects, the first light sensor (55) and the second light sensor (56) are suitably arranged side by side.

This photodetector (502A) is able to detect any defect in the first light sensor (55) accurately.

In a photodetector (502A) according to a fortieth aspect, which may be implemented in conjunction with any one of the thirty-third to thirty-ninth aspects, suitably further includes a condensing member (9) to converge the signal light (L3A) toward a focus position (Z1). The first light sensor (55) is suitably located closer to the focus position (Z1) than the second light sensor (56) is.

This photodetector (502A) is able to make the quantity of light received by the second light sensor (56) less than that of light received by the first light sensor (55).

In a photodetector (502A) according to a forty-first aspect, which may be implemented in conjunction with any one of the thirty-third to fortieth aspects, the signal light (L3A) suitably includes a laser beam (L1A).

This photodetector (502A) is able to detect any defect in the first light sensor (55) in a device for generating a laser beam (L1A).

In a photodetector (502A) according to a forty-second aspect, which may be implemented in conjunction with the forty-first aspect, the signal light (L3A) is suitably a wavelength-converted light beam produced by having the laser beam (L1A) subjected to wavelength conversion processing by the wavelength converting member (41A).

This photodetector (502A) is able to detect any defect in the first light sensor (55) in a device for producing a wavelength-converted light beam.

A photodetector (502B) according to a forty-third aspect includes: a light sensor (53B); an amplification factor changing unit (53d); and a defect detecting unit (54B). The light sensor (53B) includes: a photoelectric transducer (531B) to transform the signal light (L3B) into an electrical signal (I10); and an amplification unit (532B) to amplify the electrical signal and output the amplified electrical signal as a detection signal (Y1B). The amplification factor changing unit (53d) changes an amplification factor of the amplification unit (532B). The defect detecting unit (54B) performs sensor defect detection processing for detecting any defect in the light sensor (53B) based on the detection signal (Y1B). The defect detecting unit (54B) determines, when a variation (ΔVy11) in the magnitude (Vy11) of the detection signal (Y1B) is smaller than a decision threshold value (K11) as the amplification factor varies, the light sensor (53B) to be defective.

This photodetector (502B) is able to detect any defect in the light sensor (53B) accurately.

In a photodetector (502B) according to a forty-fourth aspect, which may be implemented in conjunction with the forty-third aspect, in a situation where the light sensor (53B) is normal and the amplification factor is maximum, when the quantity (QB) of the signal light (L3B) exceeds a first value (Qd1), the magnitude (Vy11) of the detection signal (Y1B) suitably becomes equal to or greater than a second value (Vc1).

This photodetector (502B) is able to broaden the dynamic range of the quantity (QB) of the signal light (L3B).

In a photodetector (502B) according to a forty-fifth aspect, which may be implemented in conjunction with the forty-fourth aspect, the second value (Vc1) is suitably a saturated value of the magnitude (Vy11) of the detection signal (Y1B).

This photodetector (502B) is able to broaden the dynamic range of the quantity (QB) of the signal light (L3B).

In a photodetector (502B) according to a forty-sixth aspect, which may be implemented in conjunction with any one of the forty-third to forty-fifth aspects, the amplification factor changing unit (53d) suitably changes the amplification factor periodically.

This photodetector (502B) is able to detect any defect in the light sensor (53B) periodically.

In a photodetector (502B) according to a forty-seventh aspect, which may be implemented in conjunction with any one of the forty-third to forty-sixth aspects, the amplification factor changing unit (53d) suitably makes a period (T1) in which the amplification factor is set at a maximum value longer than a period (T2) in which the amplification factor is set at a value other than the maximum value.

This photodetector (502B) is able to perform feedback control and detection of other defects in the period (T1) in which the amplification factor is set at the maximum value.

In a photodetector (502B) according to a forty-eighth aspect, which may be implemented in conjunction with any one of the forty-third to forty-seventh aspects, the variation is suitably the magnitude ($\Delta$Vy11) of decrease in the level (Vy11) of the detection signal (Y1B). The defect detecting unit (54B) determines, when the magnitude ($\Delta$Vy11) of decrease is smaller than a decision threshold value (K11) as the amplification factor decreases, the light sensor (53B) to be defective.

This photodetector (502B) is still able to detect any defect in the light sensor (53B) accurately even when the dynamic range of the quantity (QB) of the signal light (L3B) is broadened.

The invention claimed is:

1. A light source device to be used with: a light guide member configured to guide light from a first end to a second end, and vice versa; and a wavelength converting member configured to convert a first light beam that has been incident on the first end and has emerged through the second end into a second light beam having a different wavelength from the first light beam, the light source device comprising:
    at least one light-emitting element configured to radiate the first light beam to be incident on the first end by being supplied with a drive current;
    a light sensor configured to detect signal light, the signal light being a component of the second light beam having been incident on the second end and transmitted to the first end; and
    a driving unit configured to supply the drive current to the at least one light-emitting element and control the drive current based on a result of detection of the signal light.

2. The light source device of claim 1, wherein
    the driving unit is configured to control the drive current such that the signal light has a predetermined light quantity.

3. The light source device of claim 1, wherein
    the at least one light-emitting element includes a plurality of light-emitting elements.

4. The light source device of claim 3, further comprising a defect detecting unit configured to detect any defect in the wavelength converting member, the light guide member, and the plurality of light-emitting elements based on a ratio of decrease in the quantity of the signal light.

5. The light source device of claim 4, wherein
    the defect detecting unit is configured to, when the ratio of decrease is greater than a threshold value, detect any defect in at least one of the wavelength converting member or the light guide member, and is also configured to, when the ratio of decrease is equal to or less than the threshold value, detect any defect in some of the plurality of light-emitting elements.

6. The light source device of claim 5, further comprising a defective element spotting unit configured to, when the defect detecting unit detects any defect in some of the plurality of light-emitting elements, spot a defective light-emitting element among the plurality of light-emitting elements, wherein
    the defective element spotting unit is configured to turn OFF the defective light-emitting element.

7. The light source device of claim 6, wherein
    the defective element spotting unit includes:
    a plurality of switches which are provided one to one for the plurality of light-emitting elements and connected to associated light-emitting elements in parallel with each other; and
    a processing unit configured to, when the signal light does not change at a particular one of the plurality of switches that have been sequentially turned ON one by one, determine that one of the plurality of light-emitting elements, which is associated with the particular one of the switches that have been turned ON, be the defective light-emitting element.

8. The light source device of claim 5, wherein
    the driving unit is configured to, when the defect detecting unit detects a defect in at least one of the wavelength converting member or the light guide member, control the drive current so as to turn OFF all of the plurality of light-emitting elements.

9. The light source device of claim 1, wherein
    the light sensor includes a first light sensor and a second light sensor, both of which are configured to detect the signal light, and
    a second light quantity representing a quantity of the signal light received by the second light sensor is smaller than a first light quantity representing a quantity of the signal light received by the first light sensor.

10. The light source device of claim 1, wherein
    the light sensor includes: a first light sensor configured to detect the signal light and output a first electrical signal; and a second light sensor configured to detect the signal light and output a second electrical signal, and
    the first electrical signal is an analog signal with a level varying continuously as the quantity of the signal light changes, and the second electrical signal is a binary digital signal that goes zero or one according to the quantity of the signal light.

11. The light source device of claim 10, further comprising a defect detecting unit configured to detect a defect when the magnitude of the first electrical signal is equal to or greater than a first threshold value and the magnitude of the second electrical signal is less than a second threshold value.

12. The light source device of claim 10, wherein
a second light quantity representing a quantity of the signal light received by the second light sensor is smaller than a first light quantity representing a quantity of the signal light received by the first light sensor.

13. The light source device of claim 12, wherein
as the first light quantity increases, the second light quantity also increases.

14. The light source device of claim 13, wherein
the second light quantity is proportional to the first light quantity.

15. The light source device of claim 9, wherein
the first light sensor and the second light sensor are arranged side by side.

16. The light source device of claim 9, further comprising a condensing member configured to converge the signal light toward a focus position, wherein
the first light sensor is located closer to the focus position than the second light sensor is.

17. The light source device of claim 9, wherein
the signal light includes a laser beam.

18. The light source device of claim 17, wherein
the signal light is a wavelength-converted light beam produced by having the laser beam subjected to wavelength conversion processing by the wavelength converting member.

19. The light source device of claim 1, further comprising an amplification factor changing unit and a defect detecting unit, wherein
the light sensor includes: a photoelectric transducer configured to transform the signal light into an electrical signal; and an amplification unit configured to amplify the electrical signal and output the amplified electrical signal as a detection signal,
the amplification factor changing unit is configured to change an amplification factor of the amplification unit,
the defect detecting unit is configured to perform sensor defect detection processing for detecting any defect in the light sensor based on the detection signal, and
the defect detecting unit is configured to, when a variation in the magnitude of the detection signal is smaller than a decision threshold value as the amplification factor varies, determine the light sensor to be defective.

20. The light source device of claim 19, wherein
in a situation where the light sensor is normal and the amplification factor is maximum, when the quantity of the signal light exceeds a first value, the magnitude of the detection signal becomes equal to or greater than a second value.

21. The light source device of claim 20, wherein
the second value is a saturated value of the magnitude of the detection signal.

22. The light source device of claim 19, wherein
the amplification factor changing unit is configured to change the amplification factor periodically.

23. The light source device of claim 19, wherein
the amplification factor changing unit is configured to make a period in which the amplification factor is set at a maximum value longer than a period in which the amplification factor is set at a value other than the maximum value.

24. The light source device of claim 19, wherein
the variation is the magnitude of decrease in level of the detection signal, and
the defect detecting unit is configured to, when the magnitude of decrease is smaller than a decision threshold value as the amplification factor decreases, determine the light sensor to be defective.

25. A light source driver for use with: a light guide member configured to guide light from a first end to a second end, and vice versa; a wavelength converting member configured to convert a first light beam that has been incident on the first end and has emerged through the second end into a second light beam having a different wavelength from the first light beam; and at least one light-emitting element configured to radiate the first light beam by being supplied with a drive current, the light source driver comprising:
a light sensor configured to detect signal light, the signal light being a component of the second light beam and having been incident on the second end and transmitted to the first end; and
a driving unit configured to supply the drive current to the at least one light-emitting element and control the drive current based on a result of detection of the signal light.

26. The light source driver of claim 25, wherein
the light sensor includes a first light sensor and a second light sensor, both of which are configured to detect the signal light, and
a second light quantity representing a quantity of the signal light received by the second light sensor is smaller than a first light quantity representing a quantity of the signal light received by the first light sensor.

27. The light source driver of claim 25, wherein
the light sensor includes: a first light sensor configured to detect the signal light and output a first electrical signal; and a second light sensor configured to detect the signal light and output a second electrical signal, and
the first electrical signal is an analog signal with a level varying continuously as the quantity of the signal light changes, and the second electrical signal is a binary digital signal that goes zero or one according to the quantity of the signal light.

28. The light source driver of claim 25, wherein
the light sensor includes: a photoelectric transducer configured to transform the signal light into an electrical signal; and an amplification unit configured to amplify the electrical signal and output the amplified electrical signal as a detection signal,
the light source driver comprises:
an amplification factor changing unit configured to change an amplification factor of the amplification unit; and
a defect detecting unit configured to perform sensor defect detection processing for detecting any defect in the light sensor based on the detection signal, and
the defect detecting unit is configured to, when a variation in the magnitude of the detection signal is smaller than a decision threshold value as the amplification factor varies, determine the light sensor to be defective.

29. A lighting system comprising:
a light guide member configured to guide light from a first end to a second end, and vice versa;
a wavelength converting member configured to convert a first light beam that has been incident on the first end and has emerged through the second end into a second light beam having a different wavelength from the first light beam;

at least one light-emitting element configured to radiate the first light beam by being supplied with a drive current;

a light sensor configured to detect signal light, the signal light being a component of the second light beam and having been incident on the second end and transmitted to the first end; and a driving unit configured to supply the drive current to the at least one light-emitting element and control the drive current based on a result of detection of the signal light.

30. The lighting system of claim 29, wherein the light sensor includes a first light sensor and a second light sensor, both of which are configured to detect the signal light, and a second light quantity representing a quantity of the signal light received by the second light sensor is smaller than a first light quantity representing a quantity of the signal light received by the first light sensor.

31. The lighting system of claim 29, wherein the light sensor includes: a first light sensor configured to detect the signal light and output a first electrical signal; and a second light sensor configured to detect the signal light and output a second electrical signal, and the first electrical signal is an analog signal with a level varying continuously as the quantity of the signal light changes, and the second electrical signal is a binary digital signal that goes zero or one according to the quantity of the signal light.

32. The lighting system of claim 29, wherein the light sensor includes: a photoelectric transducer configured to transform the signal light into an electrical signal; and an amplification unit configured to amplify the electrical signal and output the amplified electrical signal as a detection signal, the lighting system comprises:

an amplification factor changing unit configured to change an amplification factor of the amplification unit; and a defect detecting unit configured to perform sensor defect detection processing for detecting any defect in the light sensor based on the detection signal, and the defect detecting unit is configured to, when a variation in the magnitude of the detection signal is smaller than a decision threshold value as the amplification factor varies, determine the light sensor to be defective.

* * * * *